United States Patent
Oh et al.

(10) Patent No.: US 9,859,288 B2
(45) Date of Patent: Jan. 2, 2018

(54) SEMICONDUCTOR DEVICES INCLUDING AN AIR-GAP AND METHODS OF MANUFACTURING THE SAME

(71) Applicant: Samsung Electronics Co., Ltd., Suwon-si (KR)

(72) Inventors: Sang-Woo Oh, Seoul (KR); Dae-Sin Kim, Yongin-si (KR); Young-Kwan Park, Suwon-si (KR); Keun-Ho Lee, Seongnam-si (KR); Seon-Young Lee, Seoul (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 202 days.

(21) Appl. No.: 14/700,404

(22) Filed: Apr. 30, 2015

(65) Prior Publication Data
US 2015/0236028 A1      Aug. 20, 2015

Related U.S. Application Data

(63) Continuation of application No. 13/216,004, filed on Aug. 23, 2011, now Pat. No. 9,035,419.

(30) Foreign Application Priority Data

Aug. 26, 2010 (KR) .................. 10-2010-0082753

(51) Int. Cl.
*H01L 21/764* (2006.01)
*H01L 27/115* (2006.01)
(Continued)

(52) U.S. Cl.
CPC .. *H01L 27/11517* (2013.01); *H01L 21/28273* (2013.01); *H01L 21/764* (2013.01); *H01L 21/76224* (2013.01); *H01L 29/0653* (2013.01)

(58) Field of Classification Search
CPC ............ H01L 21/76289; H01L 21/764; H01L 21/7682; H01L 21/28273; H01L 21/76224;
(Continued)

(56) References Cited

U.S. PATENT DOCUMENTS 6,917,109 B2 * 7/2005 Lur ..................... H01L 21/7682
257/522
7,064,379 B2 * 6/2006 Kutsukake ............ H01L 21/764
257/314
(Continued)

FOREIGN PATENT DOCUMENTS

JP         2008-021768       1/2008
KR    10-2008-0003184 A    1/2008
KR    10-2009-0081637 A    7/2009

*Primary Examiner* — William F Kraig
*Assistant Examiner* — Maliheh Malek
(74) *Attorney, Agent, or Firm* — Muir Patent Law, PLLC

(57) ABSTRACT

A semiconductor device including a substrate having a trench formed therein, a plurality of gate structures, an isolation layer pattern and an insulating interlayer pattern. The substrate includes a plurality of active regions defined by the trench and spaced apart from each other in a second direction. Each of the active regions extends in a first direction substantially perpendicular to the second direction. Each of the plurality of gate structures includes a tunnel insulation layer pattern, a floating gate, a dielectric layer pattern and a control gate sequentially stacked on the substrate. The isolation layer pattern is formed in the trench. First isolation layer pattern has at least one first air gap between sidewalls of at least one adjacent pair of the floating gates. The insulating interlayer pattern is formed between the gate structures, and the first insulating interlayer pattern extends in the second direction.

20 Claims, 22 Drawing Sheets

(51) Int. Cl.
*H01L 21/28* (2006.01)
*H01L 21/762* (2006.01)
*H01L 27/11517* (2017.01)
*H01L 29/06* (2006.01)
*H01L 29/788* (2006.01)

(58) Field of Classification Search
CPC ......... H01L 27/11519; H01L 27/11521; H01L 29/4991; H01L 2221/1042
See application file for complete search history.

(56) References Cited

U.S. PATENT DOCUMENTS

| | | | | |
|---|---|---|---|---|
| 7,534,696 B2* | 5/2009 | Jahnes | ................ | H01L 21/7682 257/E21.573 |
| 7,884,415 B2* | 2/2011 | Nagano | ............ | H01L 21/28273 257/314 |
| 8,053,347 B2* | 11/2011 | Kang | ................ | H01L 21/28052 257/E21.593 |
| 8,212,308 B2* | 7/2012 | Nishihara | ............. | H01L 21/764 257/321 |
| 8,294,194 B2* | 10/2012 | Noda | ................... | H01L 21/764 257/208 |
| 8,546,239 B2* | 10/2013 | Harari | ................... | H01L 21/764 257/321 |
| 8,778,749 B2* | 7/2014 | Pachamuthu | ......... | H01L 21/764 257/E21.573 |
| 8,883,611 B2* | 11/2014 | Lee | ...................... | H01L 21/764 438/421 |
| 9,035,419 B2* | 5/2015 | Oh | .................... | H01L 21/28273 257/410 |
| 2006/0261402 A1* | 11/2006 | Lue | .................... | H01L 21/28273 257/316 |
| 2007/0184615 A1* | 8/2007 | Brazzelli | ............... | H01L 21/764 438/266 |
| 2007/0257305 A1 | 11/2007 | Sasago et al. | | |
| 2008/0003743 A1* | 1/2008 | Lee | .................... | H01L 27/11521 438/257 |
| 2008/0014760 A1* | 1/2008 | Murata | ............ | H01L 21/28273 438/763 |
| 2008/0035985 A1* | 2/2008 | Shimizu | .............. | H01L 21/7682 257/316 |
| 2008/0283898 A1 | 11/2008 | Kuniya | | |
| 2009/0101883 A1* | 4/2009 | Lai | ......................... | H01L 45/06 257/3 |
| 2009/0108333 A1* | 4/2009 | Kito | ..................... | H01L 27/115 257/324 |
| 2009/0212352 A1* | 8/2009 | Aoyama | .......... | H01L 21/28273 257/324 |
| 2009/0302367 A1* | 12/2009 | Nagano | ............ | H01L 21/28273 257/316 |
| 2010/0019311 A1* | 1/2010 | Sato | .................. | H01L 21/28273 257/326 |
| 2010/0127320 A1* | 5/2010 | Nishihara | ............. | H01L 21/764 257/326 |
| 2010/0230741 A1* | 9/2010 | Choi | .................. | H01L 21/76229 257/324 |
| 2011/0303967 A1* | 12/2011 | Harari | ................... | H01L 21/764 257/321 |
| 2011/0309425 A1* | 12/2011 | Purayath | ........... | H01L 21/764 257/316 |
| 2011/0309426 A1* | 12/2011 | Purayath | ........... | H01L 21/28273 257/316 |
| 2011/0309430 A1* | 12/2011 | Purayath | ........... | H01L 21/28273 257/321 |
| 2012/0007165 A1* | 1/2012 | Lee | .................... | H01L 21/28273 257/316 |
| 2012/0037975 A1* | 2/2012 | Cho | ....................... | H01L 21/764 257/321 |
| 2012/0070976 A1* | 3/2012 | Kim | ....................... | H01L 21/764 438/594 |
| 2012/0126302 A1* | 5/2012 | Noda | .................... | H01L 21/764 257/315 |
| 2012/0126306 A1* | 5/2012 | Kawaguchi | ........... | H01L 21/764 257/319 |
| 2012/0132982 A1* | 5/2012 | Lee | .................... | H01L 21/28273 257/321 |
| 2012/0217567 A1* | 8/2012 | Sato | .................. | H01L 21/28273 257/319 |
| 2012/0223379 A1* | 9/2012 | Oh | ........................ | H01L 27/11521 257/321 |
| 2012/0256247 A1* | 10/2012 | Alsmeier | .............. | H01L 21/764 257/319 |
| 2013/0161716 A1* | 6/2013 | Kim | ................ | H01L 21/823425 257/314 |
| 2013/0164929 A1* | 6/2013 | Kuniya | ............... | H01L 21/7682 438/594 |
| 2013/0334587 A1* | 12/2013 | Purayath | ........... | H01L 21/28273 257/319 |
| 2014/0120692 A1* | 5/2014 | Purayath | ............... | H01L 21/764 438/421 |
| 2014/0124726 A1* | 5/2014 | Oh | ........................ | H01L 45/144 257/4 |
| 2014/0225251 A1* | 8/2014 | Lee | ......................... | H01L 23/28 257/734 |
| 2014/0239362 A1* | 8/2014 | Koo | .................. | H01L 27/14612 257/294 |
| 2014/0306280 A1* | 10/2014 | Lee | .................... | H01L 29/42324 257/321 |
| 2014/0312456 A1* | 10/2014 | Kim | .................... | H01L 29/0649 257/522 |

* cited by examiner

SEMICONDUCTOR DEVICES INCLUDING AN AIR-GAP AND METHODS OF MANUFACTURING THE SAME

CLAIM OF PRIORITY

This application is a continuation application of U.S. patent application Ser. No. 13/216,004, filed on Aug. 23, 2011, which claims priority under 35 U.S.C. §119 to Korean Patent Application No. 10-2010-0082753, filed on Aug. 26, 2010, the disclosure of which is hereby incorporated by reference herein in its entirety.

BACKGROUND

1. Technical Field

Example embodiments relate to semiconductor devices and methods of manufacturing the same. More particularly, example embodiments relate to semiconductor devices including an air-gap and methods of manufacturing the semiconductor devices.

2. Description of the Related Art

As the non-volatile memory devices are becoming more highly integrated, parasitic capacitances between wirings, gates and active regions have been increased. Thus, it may now be required to develop a non-volatile memory device having a low parasitic capacitance and a method of manufacturing the nonvolatile memory device having the same. However, manufacturing a non-volatile memory device having both a low parasitic capacitance and a good performance has been difficult.

Thus, there is a need in the art for a semiconductor device having a reduced parasitic capacitance and a good reliability and for a method of manufacturing the same.

SUMMARY

An example embodiment may provide a semiconductor device having a reduced parasitic capacitance and a good reliability.

An example embodiment may provide a method of manufacturing a semiconductor device having a reduced parasitic capacitance and a good reliability.

According to an example embodiment, there is provided a semiconductor device including a substrate having a trench formed therein, a plurality of gate structures, an isolation layer pattern and an insulating interlayer pattern. The substrate includes a plurality of active regions defined by the trench and spaced apart from each other in a second direction. Each of the active regions extends in a first direction substantially perpendicular to the second direction. Each of the plurality of gate structures includes a tunnel insulation layer pattern, a floating gate, a dielectric layer pattern and a control gate sequentially stacked on the substrate. The isolation layer pattern is formed in the trench. The isolation layer pattern has at least one first air gap between sidewalls of at least one adjacent pair of the floating gates. The insulating interlayer pattern is formed between the gate structures, and the first insulating interlayer pattern extends in the second direction.

In an example embodiment, a plurality of first air gaps in the isolation layer pattern may have an island shape from each other.

In an example embodiment, the first air gap in the isolation layer pattern may extend in the first direction.

In an example embodiment, the first air gap may extend near the sidewalls of the at least one adjacent pair of the floating gates in a direction perpendicular to an upper face of the substrate and a bottom of the first air gap is in the trench.

In an example embodiment, a top surface of the first air gap may have a level higher than a bottom of at least one of the floating gates, and a bottom of the first air gap may have a level higher than a bottom of the trench.

In an example embodiment, the insulating interlayer pattern may have a second air gap therein.

In an example embodiment, the second air gap may be in fluid communication with the first air gap.

In an example embodiment, the second air gap may be isolated from the first air gap.

In an example embodiment, the dielectric layer may be formed on a top surface and an upper portion of the sidewall of the floating gate, and an upper face of the isolation layer pattern.

According to an example embodiment, there is provided a method of manufacturing a semiconductor device. In the method, a preliminary tunnel insulation layer and a floating gate layer are sequentially formed on a substrate. The floating gate layer, the preliminary tunnel insulation layer and an upper portion of the substrate are partially removed to form a plurality of preliminary floating gates and a plurality of tunnel insulation layers on the substrate and trenches in the substrate, each of which extends in a first direction, respectively. Isolation layer patterns having at least one first air gap therein are formed in the trenches. A dielectric layer and a control gate layer are formed on the preliminary floating gates and the isolation layer patterns. The control gate layer, the dielectric layer and the preliminary floating gates are patterned to form a control gate, a dielectric layer pattern and floating gates on the substrate, respectively.

In an example embodiment, an insulating interlayer pattern may be further formed between the control gates.

In an example embodiment, the insulating interlayer pattern may include a second air gap therein.

In an example embodiment, the second air gap may extend in a second direction substantially perpendicular to the first direction.

In an example embodiment, a plurality of first air gaps in the isolation layer pattern may have an island shape.

In an example embodiment, the first air gap in the isolation layer pattern may extend in the first direction.

In accordance with an example embodiment of the inventive concept, a method of manufacturing a semiconductor device is provided. The method includes sequentially forming a preliminary tunnel insulation layer and a floating gate layer on a substrate, forming a first mask on the floating gate layer, etching the floating gate layer, the preliminary tunnel insulation layer and an upper portion of the substrate to form a plurality of preliminary floating gates and a plurality of tunnel insulation layers on the substrate and a plurality of trenches in the substrate, respectively, forming an isolation layer in each of the trenches, forming a first insulation layer on the isolation layer and the preliminary floating gates. The insulation layer covers opposing lateral sidewalls of each of the preliminary floating gates. The method further includes forming a second insulation layer on the first insulation layer such that the second insulation layer partially fills a gap between the preliminary floating gates, etching the second insulation layer to form a second insulation layer pattern on the opposing layer sidewalls of each the preliminary floating gates, removing a portion of the first insulation layer and an upper portion of the isolation layer therebeneath such that the remaining first insulation layer is transformed into first insulation layer patterns located on the opposing lateral sidewalls of each of the preliminary floating gates and a void is formed in the second isolation layers in each of the trenches, removing the second insulation layer pattern and an upper portion of the isolation layer such that portions of the preliminary floating gates and the tunnel insulation layers are exposed, forming a third insulation layer on the first insulation layer pattern and on an upper face of the preliminary floating gates, thereby transforming the void into at least one first air tunnel in the isolation layer in each of the trenches.

In addition, the method further includes removing a portion of the third insulating layer on the preliminary floating gates to form a plurality of third insulating layer patterns between the floating gates and on the first air tunnels, sequentially forming a dielectric layer and a conductive layer on the preliminary floating gates and the third insulation layers patterns, sequentially etching portions of the conductive layer, the dielectric layer, the preliminary floating gates, the third insulation layer patterns, the tunnel insulation layers and the second isolation layers to form a plurality of gate structures on the substrate and forming an insulating interlayer pattern between the gate structures to fill a portion of the at least one first air tunnel to form at least one first air gap between the floating gates.

According to an example embodiment of the present inventive concept, the semiconductor device may have the first insulation layer pattern having the plurality of first air gaps between the floating gates so that a parasitic capacitance between the floating gates may be reduced.

BRIEF DESCRIPTION OF THE DRAWINGS

Example embodiments of the present inventive concept can be more clearly understood from the following detailed description taken in conjunction with the accompanying drawings. FIGS. 1 to 33 represent non-limiting, example embodiments as described herein.

FIG. 1 is a cross-sectional view illustrating a semiconductor device in accordance with an example embodiment of the present inventive concept;

FIG. 2 is a perspective view illustrating the semiconductor device of FIG. 1;

FIG. 3 is a plan view illustrating the semiconductor device of FIG. 1;

FIGS. 4 to 8 are cross-sectional views illustrating a method of manufacturing the semiconductor device in FIGS. 1 to 3 in accordance with an example embodiment of the present inventive concept;

FIGS. 9 to 10 are perspective views illustrating the method of manufacturing the semiconductor device in FIGS. 1 to 3;

FIGS. 11 to 18 are cross-sectional views illustrating a method of manufacturing a semiconductor device in accordance with an example embodiment of the present inventive concept;

Figure 22:
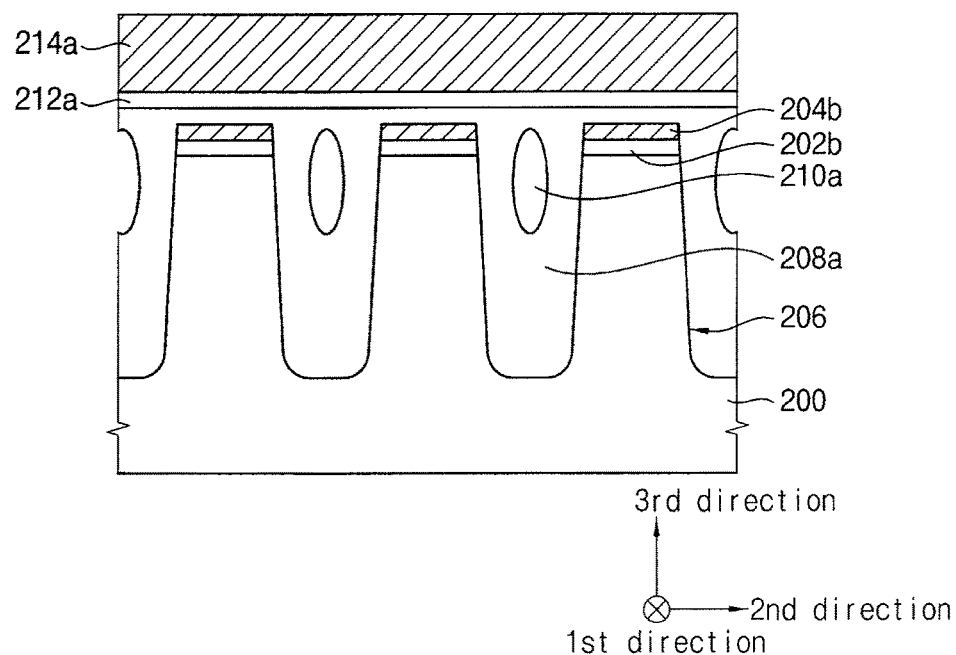
Figure 23:
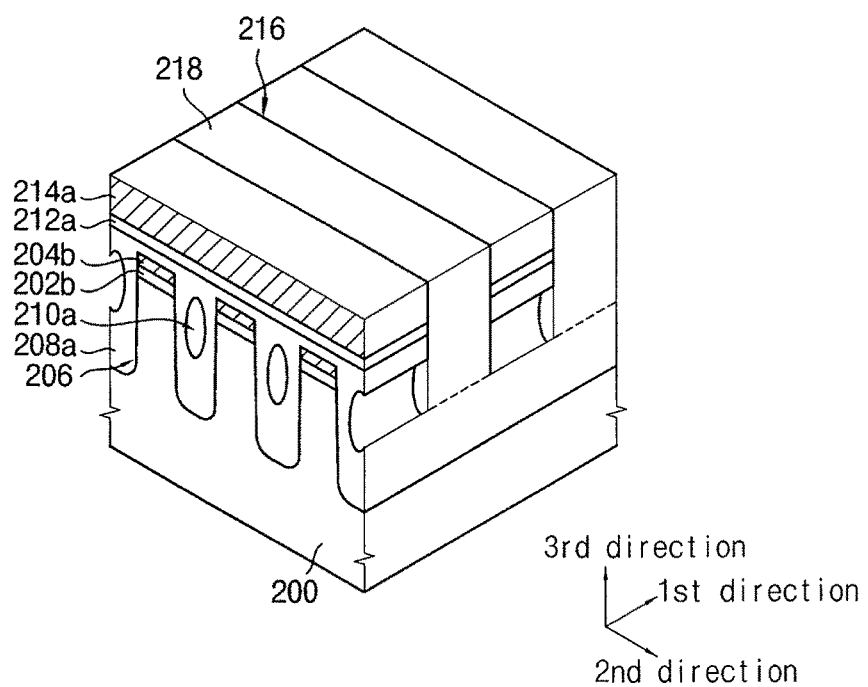

The FIG. 22 is a cross-sectional view illustrating a semiconductor device in accordance with an example embodiment of the present inventive concept;

FIG. 23 is a perspective view illustrating the semiconductor device in FIG. 22

Figure 24:
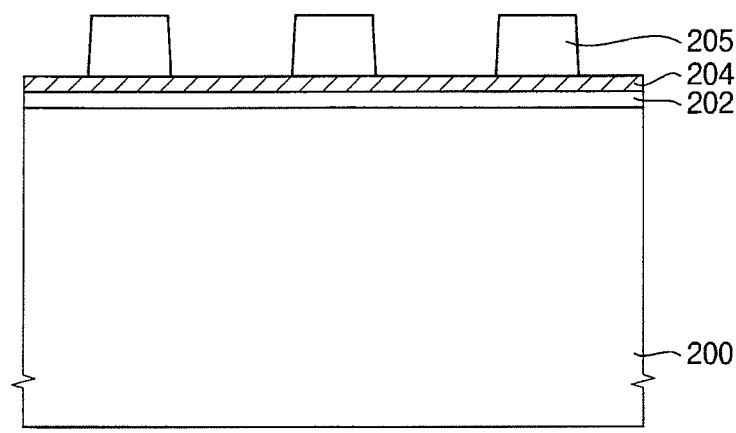
Figure 25:
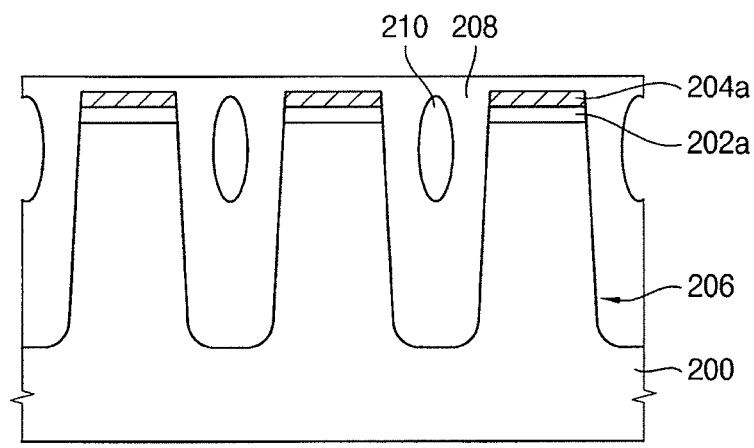
Figure 26:
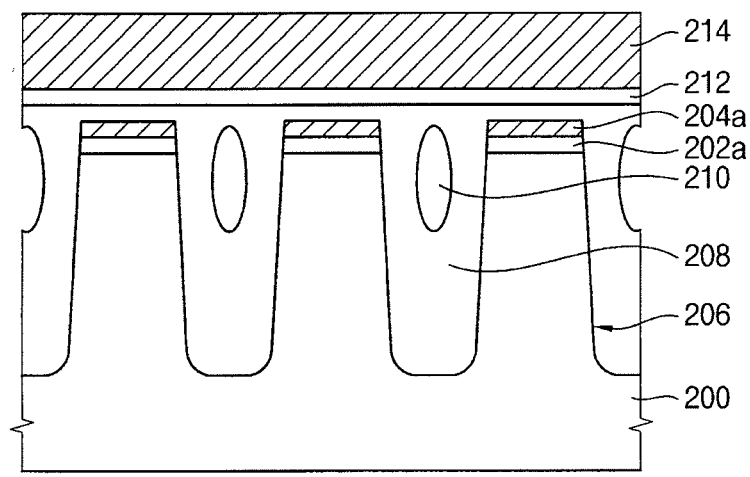
Figure 27:
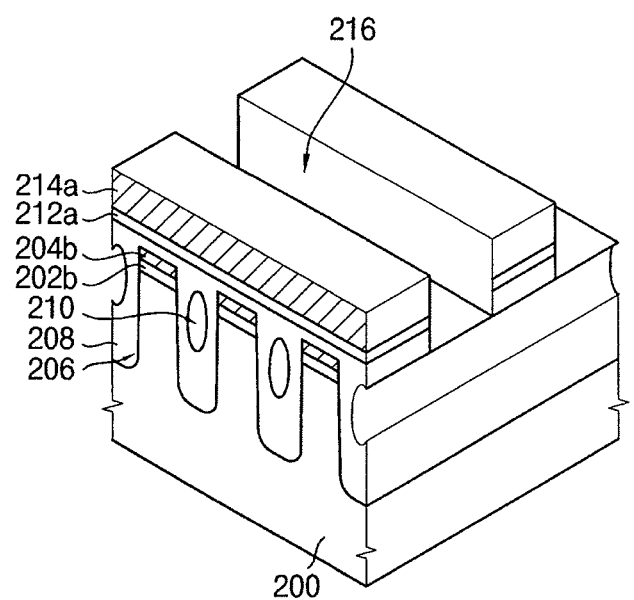
Figure 28:
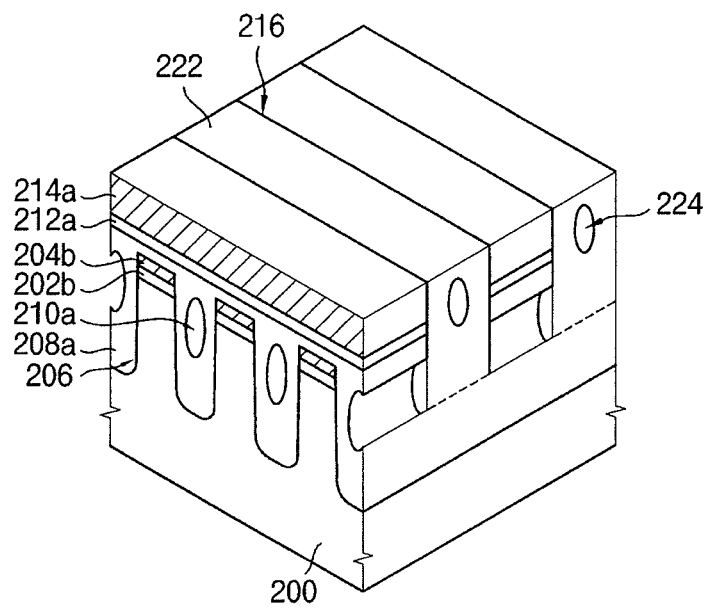
Figure 29:
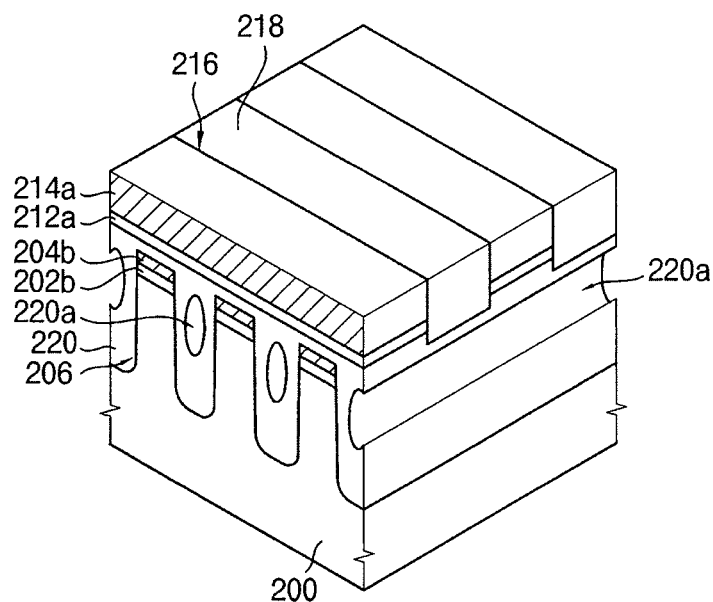
Figure 30:
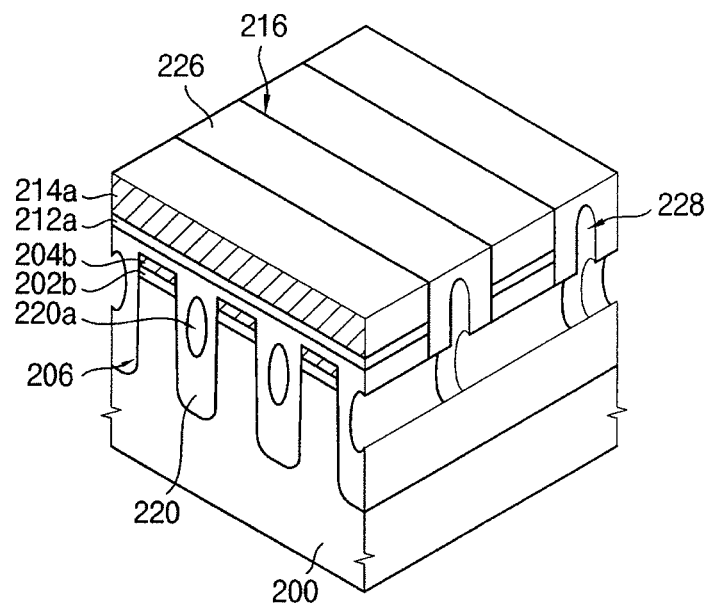
Figure 31:
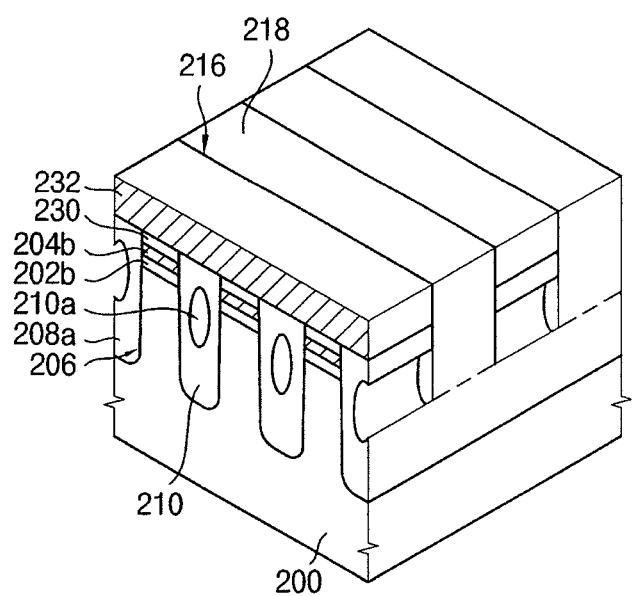
Figure 32:
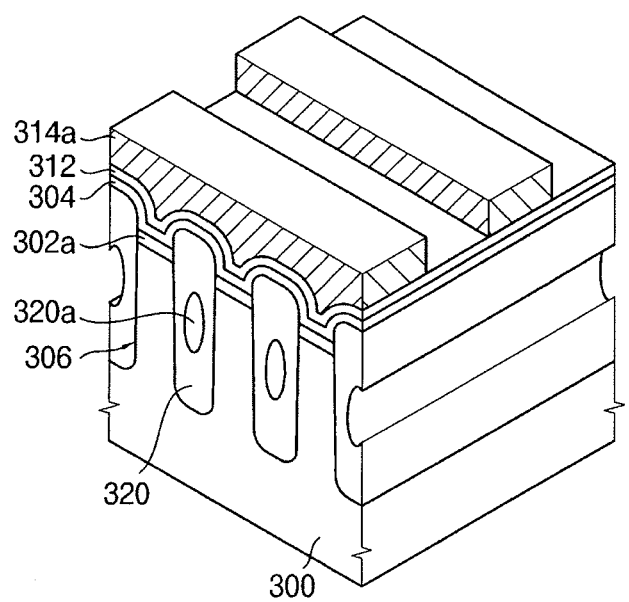
Figure 33:
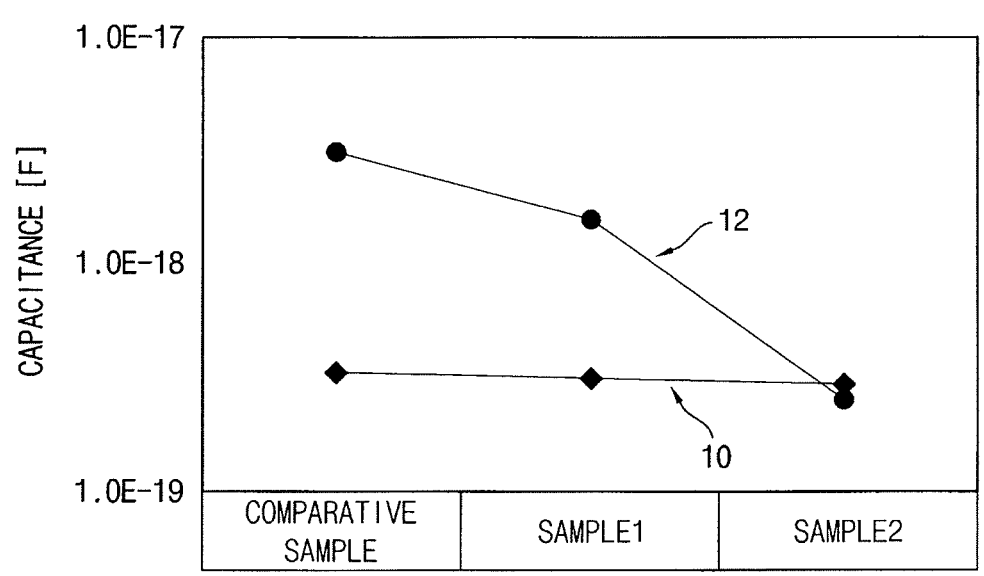

FIGS. 24 to 26 are cross-sectional views illustrating a method of manufacturing the semiconductor device in FIG. 22 in accordance with an example embodiment of the present inventive concept;

FIG. 27 is a perspective view illustrating the method of manufacturing the semiconductor device in FIG. 22;

FIG. 28 is a perspective view illustrating a semiconductor device in accordance with an example embodiment of the present inventive concept;

FIG. 29 is a perspective view illustrating a semiconductor device in accordance with an example embodiment of the present inventive concept;

FIG. 30 is a perspective view illustrating a semiconductor device in accordance with an example embodiment of the present inventive concept;

FIG. 31 is a perspective view illustrating a semiconductor device in accordance with an example embodiment of the present inventive concept;

FIG. 32 is a perspective view illustrating a semiconductor device in accordance with an example embodiment; and FIG. 33 is a graph illustrating a parasitic capacitance of a semiconductor device in accordance with an example embodiment of the present inventive concept.

DESCRIPTION OF EXAMPLE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

Figure 1:
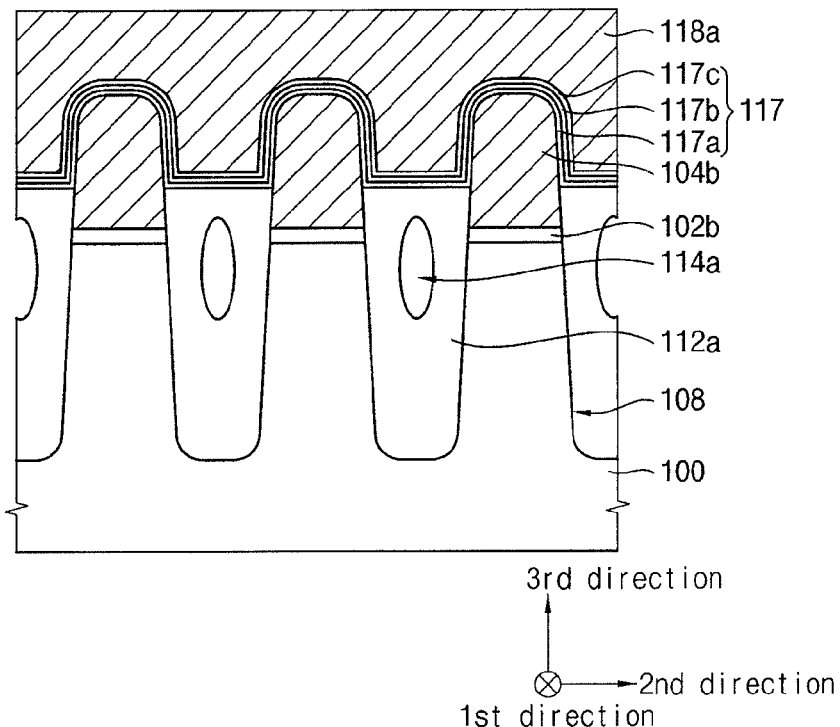
Figure 2:
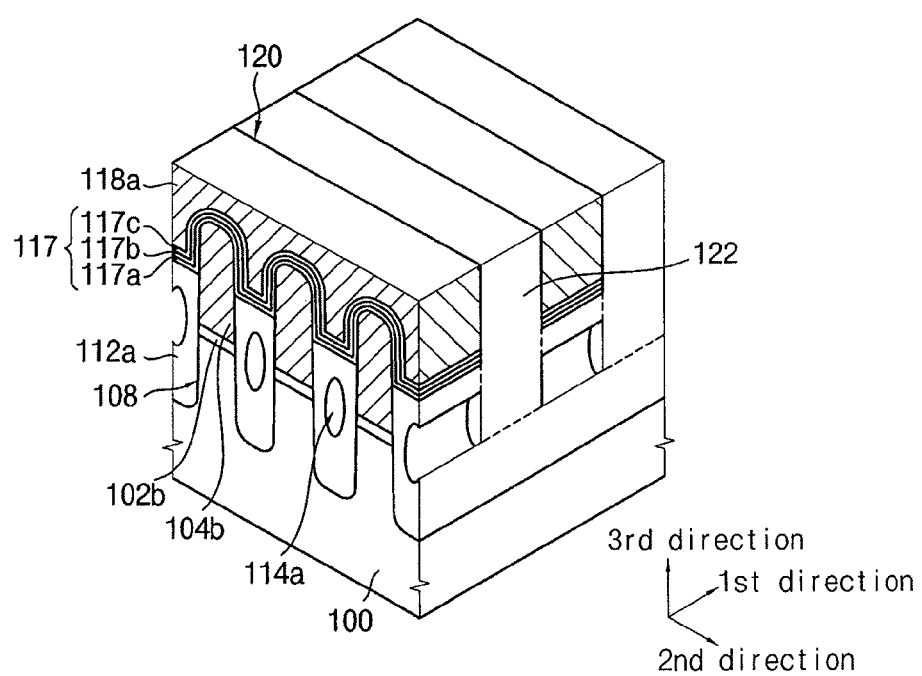
Figure 3:
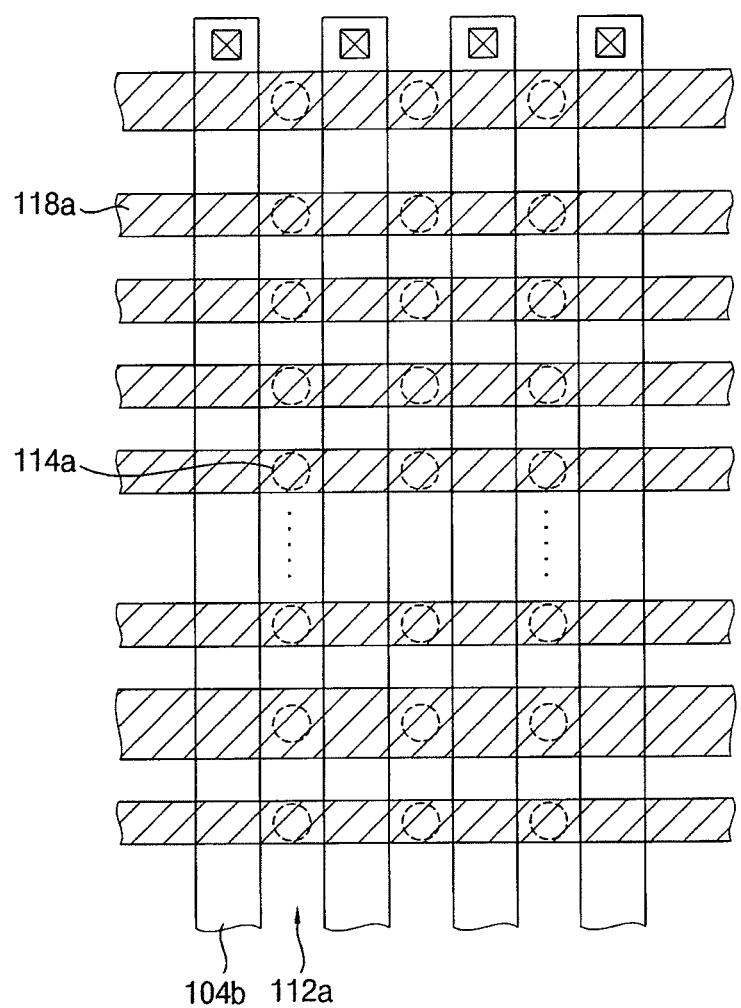

FIG. 1 is a cross-sectional view illustrating a semiconductor device in accordance with an example embodiment of the present inventive concept. FIG. 2 is a perspective view illustrating the semiconductor device of FIG. 1. FIG. 3 is a plan view illustrating the semiconductor device of FIG. 1.

Referring to FIGS. 1 to 3, the semiconductor device may have a gate structure including, for example, a tunnel insulation layer pattern 102b, a floating gate 104b, a dielectric layer pattern 117 and a control gate 118a, a first isolation layer pattern 112a having a first air gap 114a therein, and a first insulating interlayer pattern 122.

The substrate 100 may include a plurality of trenches 108 therein. For example, each trench 108 may extend in a first direction, and the trenches 108 may be spaced apart from each other in a second direction substantially perpendicular to the first direction. A region of the substrate 100 in which no trench is formed may be defined as an active region. The active region may extend, for example, in the first direction.

The tunnel insulation layer pattern 102b may be formed on the active region of the substrate 100. The tunnel insulation layer pattern 102b may include, for example, silicon oxide, silicon oxynitride, silicon oxide doped with impurities or a dielectric material having a low dielectric constant.

The floating gate 104b may be formed on the tunnel insulation layer pattern 102b. A plurality of floating gates 104b may be arranged to be spaced apart from each other both in the first and second directions. For example, the floating gates 104b may be positioned at a given interval in the first direction on the active region extending in the first direction, and the floating gates 104b may be also positioned at a given interval in the second direction. Each memory cell may include each floating gate 104b so that a plurality of memory cells may be formed at places where the plurality of floating gates 104b is formed. In an example embodiment, the floating gate 104b may include, for example, polysilicon. The floating gate 104b may have a thickness, for example, greater than about 500 Å, so that the semiconductor device may have an increased coupling ratio. In an example embodiment, the floating gate 104b may have a thickness of, for example, about 500 to about 3,000 Å.

The first isolation layer pattern 112a may be formed in the trench 108. An upper face of the first isolation layer pattern 112a may be, for example, lower than half of the height of the floating gate 104b. For example, the upper face of the first isolation layer pattern 112a may be lower than an imaginary central line drawn to cross the half of the height of the floating gate 104b, and may be higher than an upper face of the active region of the substrate 100. In an example embodiment, the first isolation layer pattern 112a may include silicon oxide.

The first isolation layer pattern 112a may include, for example, the first air gap 114a therein. The first air gap 114a may extend near a sidewall of the floating gate 104b downward, e.g., in a third direction substantially perpendicular to an upper face of the substrate 100. A bottom of the first air gap 114a may be positioned in the trench 108. A top surface of the first air gap 114a may be, for example, higher than a bottom of the floating gate 104b and lower than the imaginary central line of the floating gate 104b. Also, the bottom of the first air gap 114a may be higher than, for example, a bottom of the trench 108 and lower than the bottom of the floating gate 104b.

The first air gap 114a may be formed between adjacent floating gates 104b, and the first air gaps 114a in the trenches 108 may be spaced apart from each other. In an example embodiment, the first air gap 114a may have a cross-section of various shapes in a vertical direction, e.g., in the third direction. For example, the first air gap 114a may have a cross-section of an elliptical shape, or a rectangular shape. Also, the first air gap 114a may have, for example, a cross-section of a rectangular shape at an upper portion thereof and an elliptical shape at a lower portion thereof.

The first air gaps 114a may be formed between the active regions and also between sidewalls of the floating gates 104b, and be spaced apart from each other in the second direction, as illustrated in FIG. 2. Thus, a parasitic capacitance between the floating gates 104b and a parasitic capacitance between the floating gate 104b and the active region may be reduced.

The dielectric layer pattern 117 may be formed on the first isolation layer patterns 112a and the floating gates 104a. The dielectric layer pattern 117 may extend in, for example, the second direction. In an example embodiment, the dielectric layer pattern 117 may have, for example, a multi-layered structure of an oxide layer pattern 117a, a nitride layer pattern 117b and an oxide layer pattern 117c. Alternatively, the dielectric layer pattern 117 may include, for example, a metal oxide having a dielectric constant greater than about 10.

The control gate 118a may be formed on the dielectric layer pattern 117. The control gate 118a may, for example, fill gaps between the sidewalls of the floating gates 104b, and have a bar shape extending in the second direction. In an example embodiment, the control gate 118a may include, for example, polysilicon. Alternatively, the control gate 118a may include, for example, a metal.

The first insulating interlayer pattern 122 may be formed between the gate structures, and may extend, for example, in the second direction. The first insulating interlayer pattern 122 may include, for example, silicon oxide.

According to an example embodiment, the semiconductor device may have the first insulation layer pattern 112a having the plurality of first air gaps 114a between the floating gates 104b so that a parasitic capacitance between the floating gates 104b may be reduced.

Figure 7:
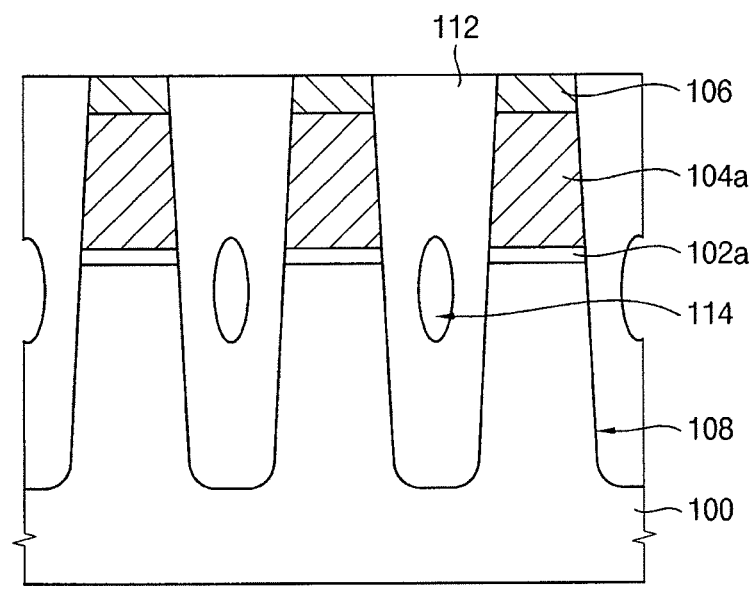
Figure 8:
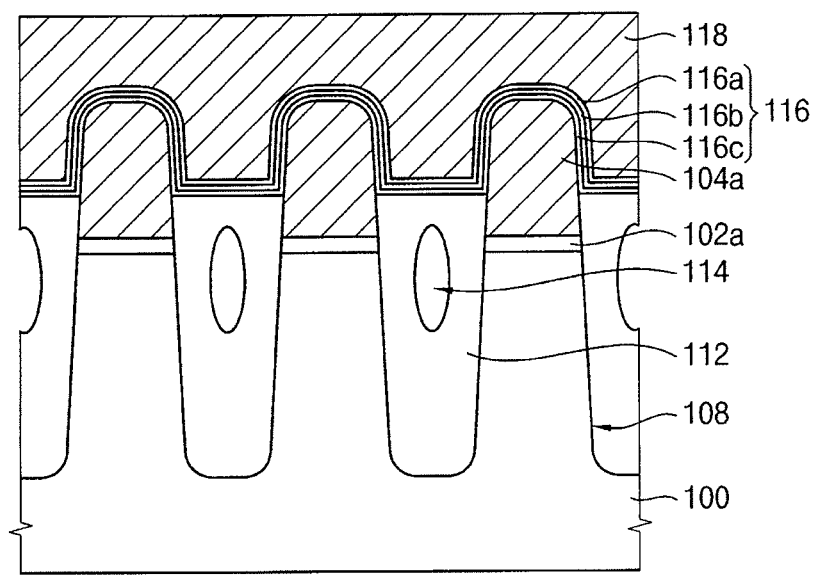
Figure 9:
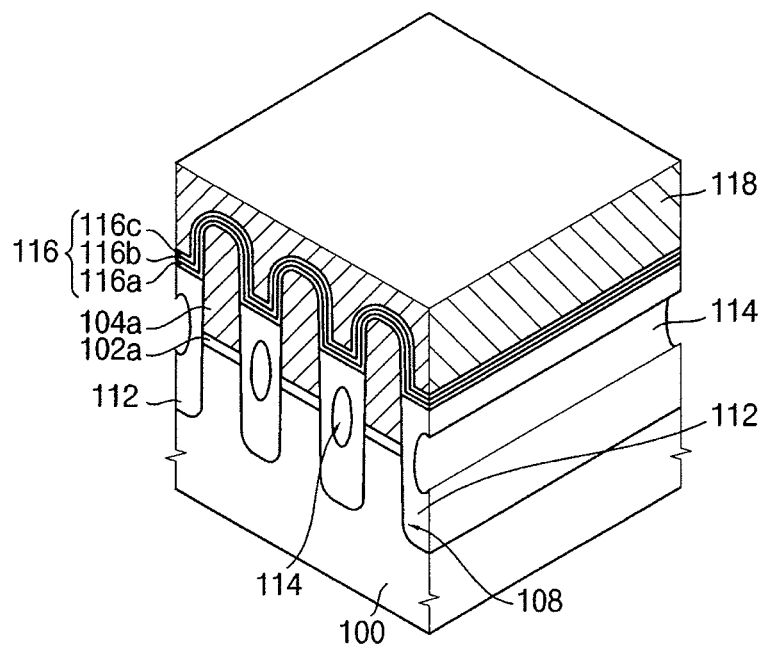
Figure 10:
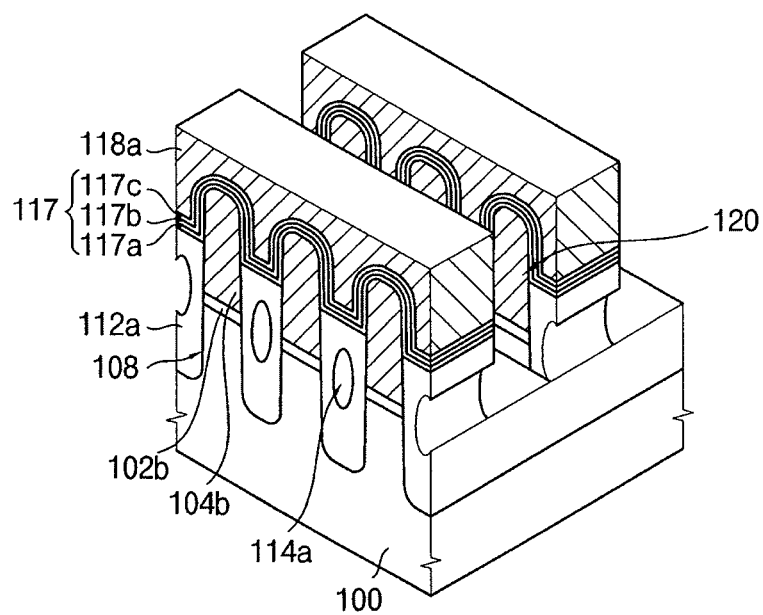

FIGS. 4 to 8 are cross-sectional views illustrating a method of manufacturing the semiconductor device in FIGS. 1 to 3 in accordance with an example embodiment of the present inventive concept, and FIGS. 9 to 10 are perspective views illustrating the method of manufacturing the semiconductor device in FIGS. 1 to 3.

Figure 4:
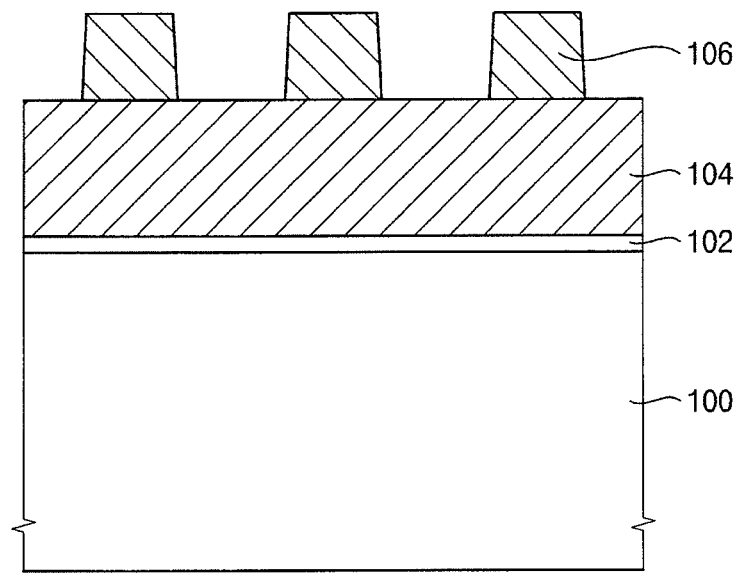

Referring to FIG. 4, a preliminary tunnel insulation layer 102 and a floating gate layer 104 may be sequentially formed on a substrate 100. In an example embodiment, the substrate 100 may include, for example, single-crystalline silicon. The preliminary tunnel insulation layer 102 may be formed by, for example, a thermal oxidation process on the substrate 100. The floating gate layer 104 may be formed on the preliminary tunnel insulation layer 102 using, for example, polysilicon to have a thickness greater than about 1000 Å.

A first mask 106 may be formed on the floating gate layer 104. The first mask 106 may serve as an etching mask for forming a trench, and have, for example, a bar shape extending in a first direction. In an example embodiment, the first mask 106 may be, for example, a photoresist pattern or a hard mask.

Figure 5:
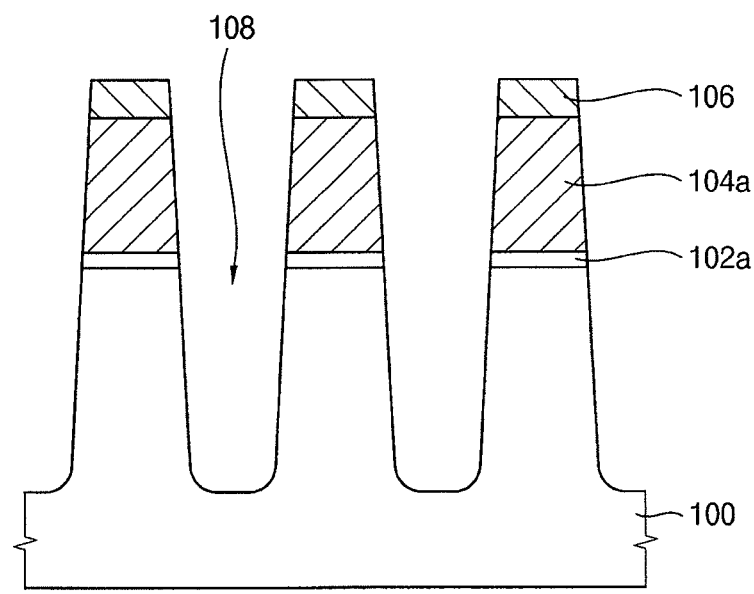

Referring to FIG. 5, the floating gate layer 104, the preliminary tunnel insulation layer 102 and an upper portion of the substrate 100 may be sequentially etched using, for example, the first mask 106 as an etching mask. Thus, a preliminary floating gate 104a and a tunnel insulation layer 102a may be formed on the substrate 100, and a trench 108 may be formed in the substrate 100. A region of the substrate 100 in which the trench 108 is not formed may be defined as an active region.

Figure 6:
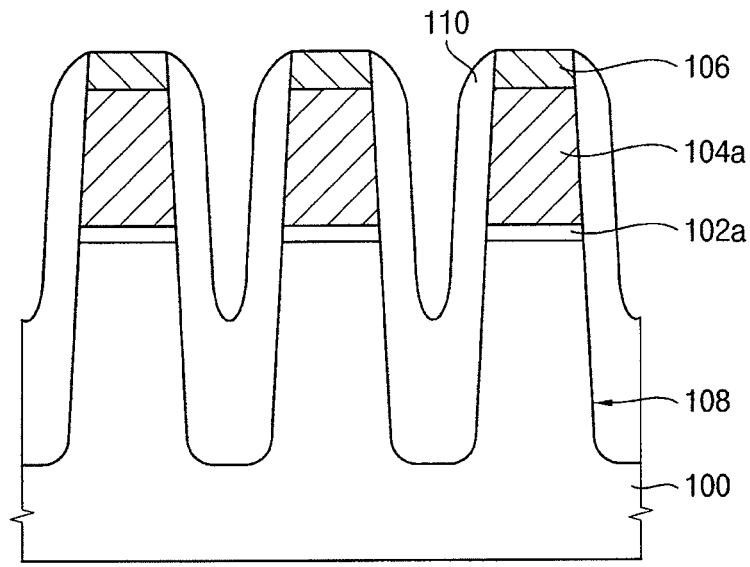

Referring to FIG. 6, a first insulation layer 110 may be formed on an inner wall of the trench 108, sidewalls of the tunnel insulation layer 102a and the preliminary floating gate 104a to partially fill the trench 108. For example, first insulation layer 110 may be formed using silicon oxide such as plasma enhanced oxide (PEOX) or medium temperature oxide (MTO) by a chemical vapor deposition (CVD) process, a plasma enhanced CVD (PECVD) process or a low pressure CVD (LPCVD) process. The space between the preliminary floating gates 104a may be reduced due to the first insulation layer 110. An additional wet etching process may be performed to remove a portion of the first insulation layer 110. An upper face of the first insulation layer 110 that is formed at a lowest level may become a bottom of a first air tunnel 114 (refer to FIG. 7) which may be formed in a subsequent process. Thus, the wet etching process may be performed on the first insulation layer 110 to control a position of the bottom of the first air tunnel 114.

Referring to FIG. 7, a second insulation layer may be formed on the first insulation layer 110 to fill an upper portion of the gap between the preliminary floating gates 104a. The second insulation layer may be formed using, for example, a material having poor step coverage characteristics, or by a deposition process of which the resultant deposited material has poor step coverage characteristics. In an example embodiment, the second insulation layer may be formed using a material substantially the same as that of the first insulation layer 110, e.g., silicon oxide such as PEOX or MTO, and thus may be merged with the first insulation layer 110 into a single layer.

The merged single layer may be planarized until a top surface of the first mask 106 is exposed to form a first isolation layer 112 in the trench 108 and in the gap between the preliminary floating gates 104a.

The first isolation layer 112 may include, for example, the first air tunnel 114 therein. The first air tunnel 114 may, for example, extend in the first direction parallel to the extending direction of the trench 108.

In an example embodiment, for example, a top surface of the first air tunnel 114 in the first isolation layer 112 may be formed at a level higher than a bottom of the preliminary floating gate 104a and lower than an imaginary central line thereof. A bottom of the first air tunnel 114 in the first isolation layer 112 may be formed, for example, at a level lower than a bottom of the preliminary floating gate 104a and higher than the bottom of the trench 108.

Referring to FIGS. 8 to 9, an upper portion of the first isolation layer 112 may be removed. When the first isolation layer 112 is etched, the first air tunnel 114 may not be exposed. A top surface of the first isolation layer 112 may be formed, for example, at a level lower than the imaginary central line of the preliminary floating gate 104a.

A dielectric layer 116 may be formed on the preliminary floating gates 104a and the first isolation layers 112. In an example embodiment, the dielectric layer 116 may be formed by, for example, sequentially forming a silicon oxide layer 116a, a silicon nitride layer 116b and a silicon oxide layer 116c. Alternatively, the dielectric layer 116 may be formed using, for example, a metal oxide having a dielectric constant greater than about 10.

A conductive layer 118 may be formed on the dielectric layer 116. The conductive layer 118 may be formed using, for example, polysilicon or a metal.

Referring to FIG. 10, a second mask (not shown) may be formed on the conductive layer 118. The second mask may serve as an etching mask for forming a control gate 118a. The second mask may have, for example, a bar shape extending in the second direction.

The conductive layer 118, the dielectric layer 116, the preliminary floating gate 104a, the tunnel insulation layer 102a, and the first isolation layer 112 may be sequentially etched using, for example, the second mask as an etching mask to form an opening 120. Thus, a gate structure including a tunnel insulation layer pattern 102b, a floating gate 104b, a dielectric layer pattern 117 and a control gate 118a may be formed, and the first isolation layer 112 may be transformed into a first isolation layer pattern 112a. The floating gates 104b may have, for example, an island shape. The tunnel insulation layer patterns 102b may also have, for example, an island shape. The opening 120 may be in fluid communication with the first air tunnels 114.

Referring to FIGS. 1 to 2 again, a first insulating interlayer pattern 122 may be formed to fill the opening 120 between adjacent gate structures. When the first insulating interlayer pattern 122 is formed in the opening 120, a portion of the first air tunnel 114 in fluid communication with the opening 120 may be also filled with the first insulating interlayer pattern 122. Thus, a plurality of first air gaps 114a having, for example, an island shape may be formed between the floating gates 104b.

FIGS. 11 to 18 are cross-sectional views illustrating a method of manufacturing a semiconductor device in accordance with an example embodiment of the present inventive concept.

Figure 11:
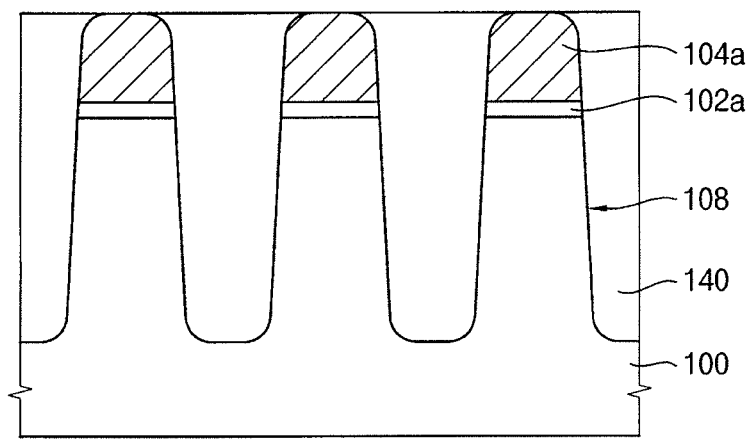

Referring to FIG. 11, a preliminary tunnel insulation layer 102 and a floating gate layer 104 may be sequentially formed on a substrate 100. In an example embodiment, the substrate 100 may include, for example, single-crystalline silicon. A first mask (not shown) may be formed on the floating gate layer.

The floating gate layer 104, the preliminary tunnel insulation layer 102 and an upper portion of the substrate 100 may be sequentially etched using, for example, the first mask as an etching mask. Thus, a preliminary floating gate 104a and a tunnel insulation layer 102a may be formed on the substrate 100, and a trench 108 may be formed in the substrate 100. An upper face of the substrate 100 on which no trench is formed 108 may be defined as an active region. The processes illustrated above may be substantially the same as those illustrated with reference to FIGS. 4 to 5.

A third insulation layer may be formed to sufficiently fill the trench 108 and a gap between the floating gates 104a. In an example embodiment, the third insulation layer may be formed using, for example, an oxide of which a bonding structure is not compact and a gap-filling characteristic is good. For example, the third insulation layer may be formed using spin-on glass (SOG) or flowable oxide (FOX). An upper portion of the third insulation layer may be planarized by, for example, a chemical mechanical polishing (CMP) process or an etch-back process to form a second isolation layer 140. The first mask may be removed during the planarization process.

Figure 12:
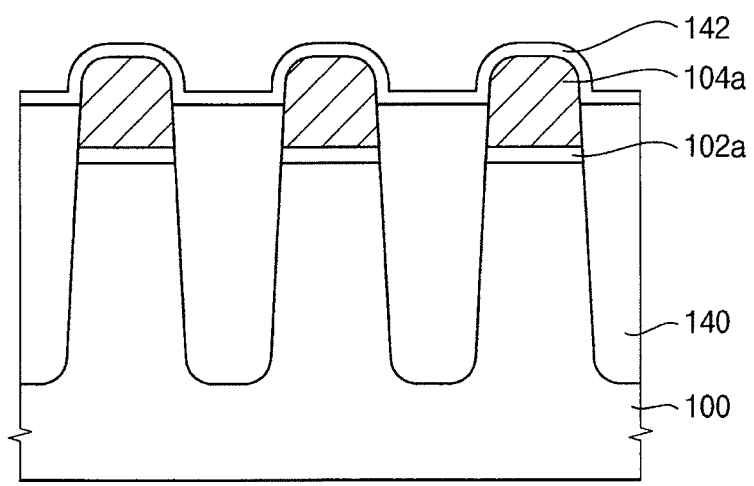
Figure 12:
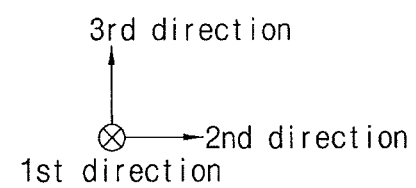

Referring to FIG. 12, a portion of the second isolation layer 140 may be etched, so that an upper face of the second isolation layer 140 may be, for example, lower than a top surface of the preliminary floating gate 104a and higher than an upper face of the tunnel insulation layer 102a. In an example embodiment, the portion of the second isolation layer 140 may be etched by, for example, a dry etching process or a wet etching process to form a gap between the preliminary floating gates 104a.

A fourth insulation layer 142 may be formed on the second isolation layer 140 and the preliminary floating gates 104a. The fourth insulation layer 142 may be formed using, for example, silicon oxide such as MTO. The fourth insulation layer 142 may be formed to cover the sidewalls of the preliminary floating gates 104a so that the space between the preliminary floating gates 104a may be reduced.

Figure 13:
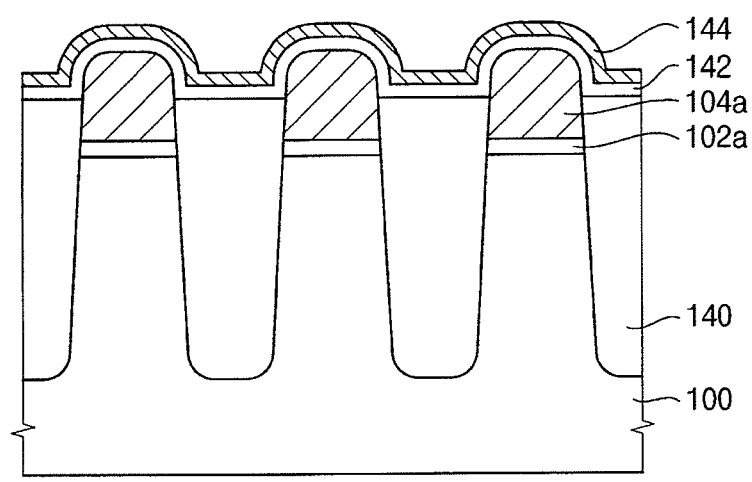

Referring to FIG. 13, a fifth insulation layer 144 may be formed on the fourth insulation layer 142. In an example embodiment, the fifth insulation layer 144 may be formed using a material having an etching selectivity with respect to both the fourth insulation layer 142 and the second isolation layer 140. For example, the fifth insulation layer 144 may be formed using silicon nitride. The fifth insulation layer 144 may be formed to partially fill the gap between the preliminary floating gates 104a so that the gap therebetween may be reduced.

Figure 14:
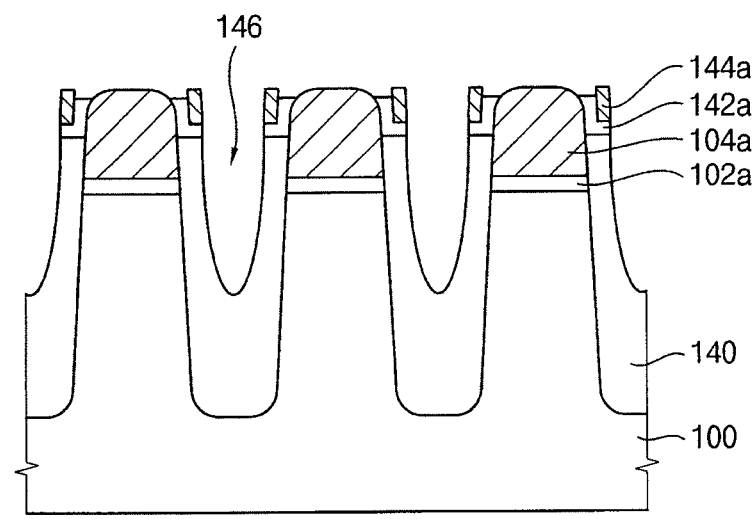

Referring to FIG. 14, the fifth insulation layer 144 may be, for example, anisotropically etched to form a fifth insulation layer pattern 144a. In an example embodiment, the fifth insulation layer pattern 144a may be formed on both sidewalls of the preliminary floating gates 104a to have, for example, a bar shape extending in the first direction.

A portion of the fourth insulation layer 142 between the fifth insulation layer patterns 144a and an upper portion of the second isolation layer 140 therebeneath may be removed. Thus, the fourth insulation layer 142 may be transformed into a fourth insulation layer pattern 142a and a void 146 may be formed in the second isolation layer 140. In an example embodiment, for example, an anisotropic etching process may be performed using an etchant having an etching selectivity with respect to silicon nitride.

Figure 15:
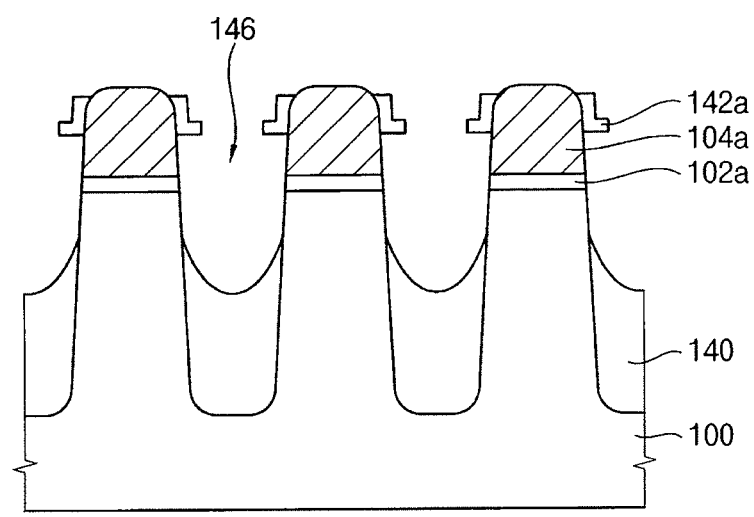

Referring to FIG. 15, the fifth insulation layer pattern 144a may be removed. In an example embodiment, for example, a wet etching process may be performed. An upper portion of the second isolation layer 140 may be also removed during the wet etching process because the second isolation layer 140 may include porous material. Thus, the void 146 may be enlarged so that sidewalls of the preliminary floating gates 104a and the tunnel insulation layer 102a, and a portion of the active region of the substrate 100 may be exposed. A bottom of the void 146 may be a bottom of a first air tunnel 114 (refer to FIG. 16) that may be formed in a subsequent process. The first air tunnel 114 may have various shapes and sizes depending on the conditions of the wet etching process.

Figure 16:
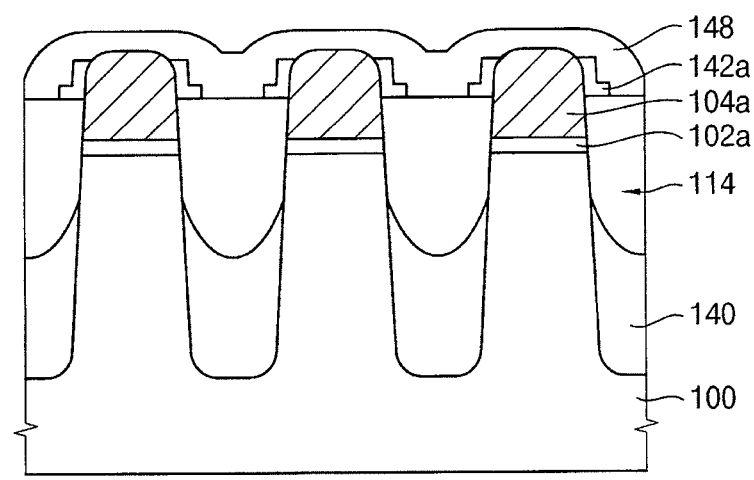

Referring to FIG. 16, a sixth insulation layer 148 may be formed on the fourth insulation layer pattern 142a and an upper face of the preliminary floating gate 104a. The sixth insulation layer 148 may be formed using, for example, a material having poor step coverage characteristics so that the sixth insulation layer 148 may be formed only at a level higher than an upper face of the fourth insulation layer pattern 142a. The sixth insulation layer 148 may not fill the void 146, and thus the first air tunnel 114 may be formed.

Figure 17:
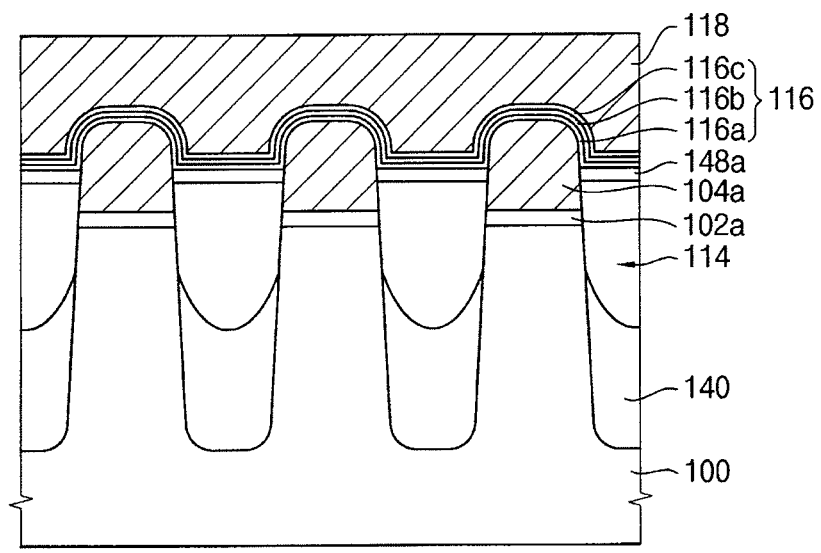

Referring to FIG. 17, a portion of the sixth insulation layer 148 on the preliminary floating gate 104a may be removed to form a plurality of sixth insulation layer patterns 148a. At this time, the fourth insulation layer pattern 142a may be also partially or completely removed. The sixth insulation layer patterns 148a may be formed between the preliminary floating gates so that the first air tunnel 114 may remain.

A dielectric layer 116 may be formed on the preliminary floating gates 104a and the sixth insulation layer patterns 148a. In an example embodiment, the dielectric layer 116 may be formed by, for example, sequentially stacking a silicon oxide layer 116a, a silicon nitride layer 116b and a silicon oxide layer 116c. Alternatively, the dielectric layer 116 may be formed using, for example, a metal oxide having a dielectric constant of greater than 10.

A conductive layer 118 may be formed on the dielectric layer 116. The conductive layer 118 may be formed using, for example, polysilicon or a metal.

Figure 18:
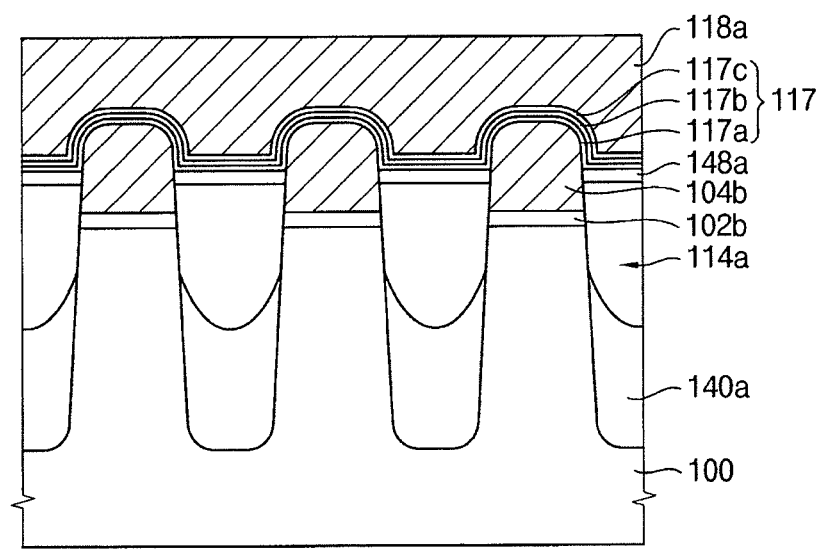

Referring to FIG. 18, a second mask (not shown) may be formed on the conductive layer 118. The second mask may serve as an etching mask for forming a control gate 118a. The second mask may have, for example, a bar shape extending in the second direction.

Portions of the conductive layer 118, the dielectric layer 116, the preliminary floating gate 104a, the sixth insulation layer pattern 148a, the tunnel insulation layer 102a and the second isolation layer 140 may be sequentially etched using, for example, the second mask as an etching mask. Thus, a gate structure including a tunnel insulation layer pattern 102b, a floating gate 104b, a dielectric layer pattern 117 and the control gate 118a may be formed, and the second isolation layer 140 may be transformed into a second isolation layer pattern 140a. An opening (not shown) may be formed between the gate structures. The floating gates 104b may have, for example, an island shape. The tunnel insulation layer patterns 102b may also have, for example, an island shape. The opening may be in fluid communication with the first air tunnels 114.

A first insulating interlayer pattern (not shown) may be formed to fill the opening between adjacent gate structures as illustrated in FIGS. 1 and 2. When the first insulating interlayer pattern is formed in the opening, a portion of the first air tunnel 114 in fluid communication with the opening may be also filled with the first insulating interlayer pattern. Thus, a plurality of first air gaps 114a having, for example, an island shape may be formed between the floating gates 104b.

A semiconductor device according to an example embodiment of the present inventive concept may be manufactured by performing the processes as illustrated above.

According to an example embodiment, the semiconductor device may include the plurality of first air gaps 114a between the floating gates 104b. Each first air gap 114a may have an upper portion having, for example, a rectangular shape. Controlling the size and position of the first air gaps 14a may be relatively easy.

Figure 19A:
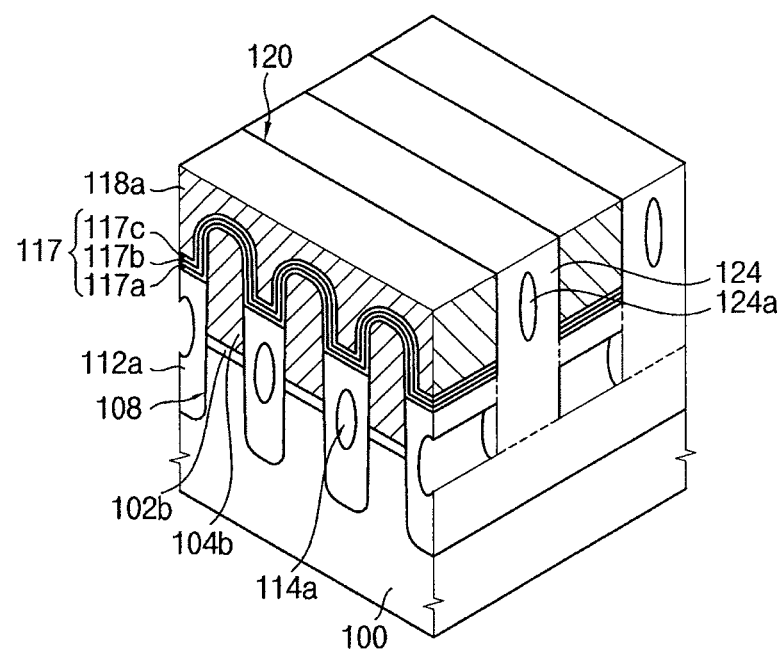
FIG. 19A is a perspective view illustrating a semiconductor device in accordance with an example embodiment of the present inventive concept.
Figure 19B:
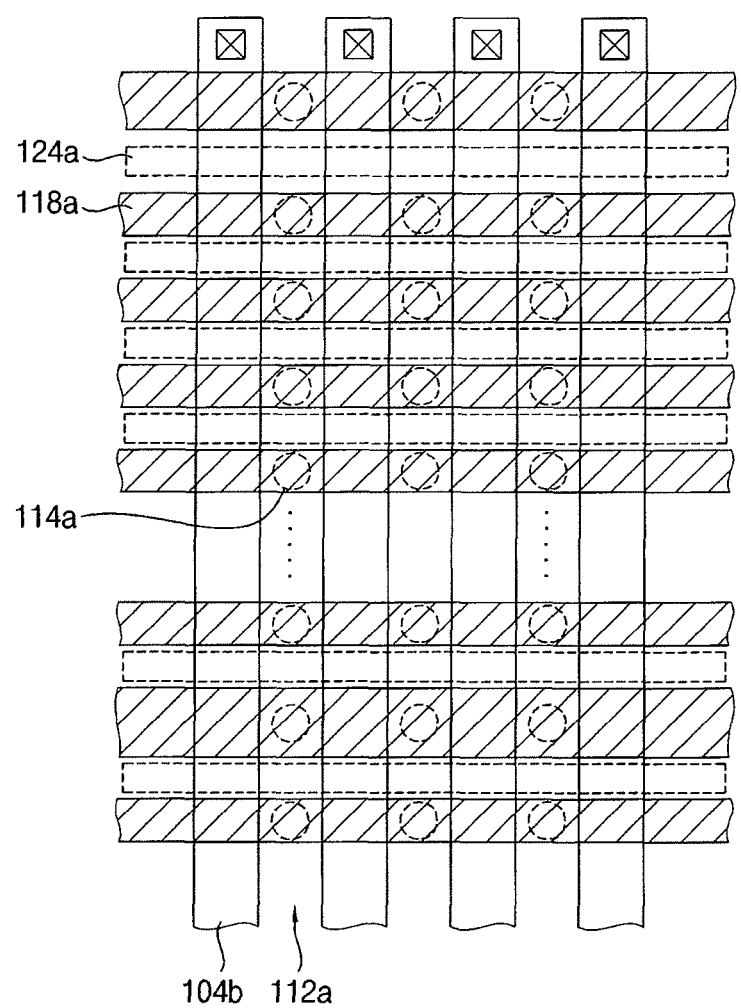
FIG. 19B is a plan view illustrating the semiconductor device in FIG. 19A.

FIG. 19A is a perspective view illustrating a semiconductor device in accordance with an example embodiment. FIG. 19B is a plan view illustrating the semiconductor device of FIG. 19A. The semiconductor device may be substantially the same as or similar to that illustrated with reference to FIG. 1 except for a shape of an insulating interlayer pattern.

Referring to FIGS. 19A and 19B, a plurality of gate structures each of which may include, for example, a tunnel insulation layer pattern 102b, a floating gate 104b, a dielectric layer pattern 117 and a control gate 118a may be formed on a substrate 100 including a trench 108 thereon. A first isolation layer pattern 112a including a first air gap 114a therein may be formed in the trench 108, and the first air gap 114a may be positioned between adjacent floating gates 104b. The first air gap 114a may have a shape substantially the same as or similar to that illustrated with reference to FIG. 1.

A second insulating interlayer pattern 124 may be formed between the gate structures and may, for example, extend in a second direction. The second insulating interlayer pattern 124 may include a second air gap 124a therein. The second air gap 124a may be positioned between the control gates 118a. In an example embodiment, the second air gap 124a may, for example, extend in the second direction. Alternatively, a plurality of second air gaps 124a having, for example, an island shape may be formed.

The semiconductor device illustrated in FIGS. 19A and 19B may be manufactured by performing processes substantially the same as or similar to those illustrated with reference to FIGS. 4 to 18.

After performing the processes illustrated with reference to FIGS. 4 to 10, the opening 120 in fluid communication with the first air tunnel 114 may be partially filled with an insulating material to form a second insulating interlayer pattern 124 having a second air gap 124a therein between adjacent gate structures. Thus, the semiconductor device in FIG. 19a may be manufactured.

Figure 20A:
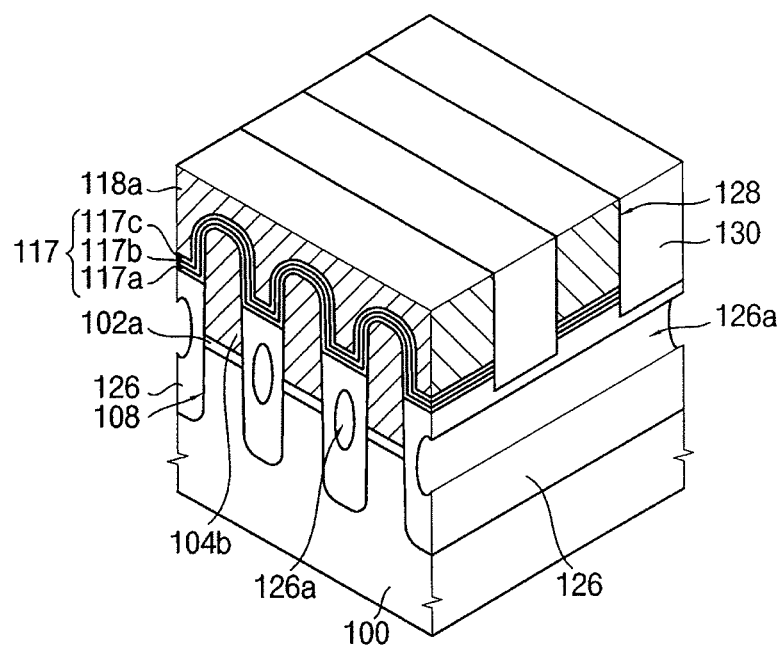
FIG. 20A is a perspective view illustrating a semiconductor device in accordance with an example embodiment of the present inventive concept.
Figure 20B:
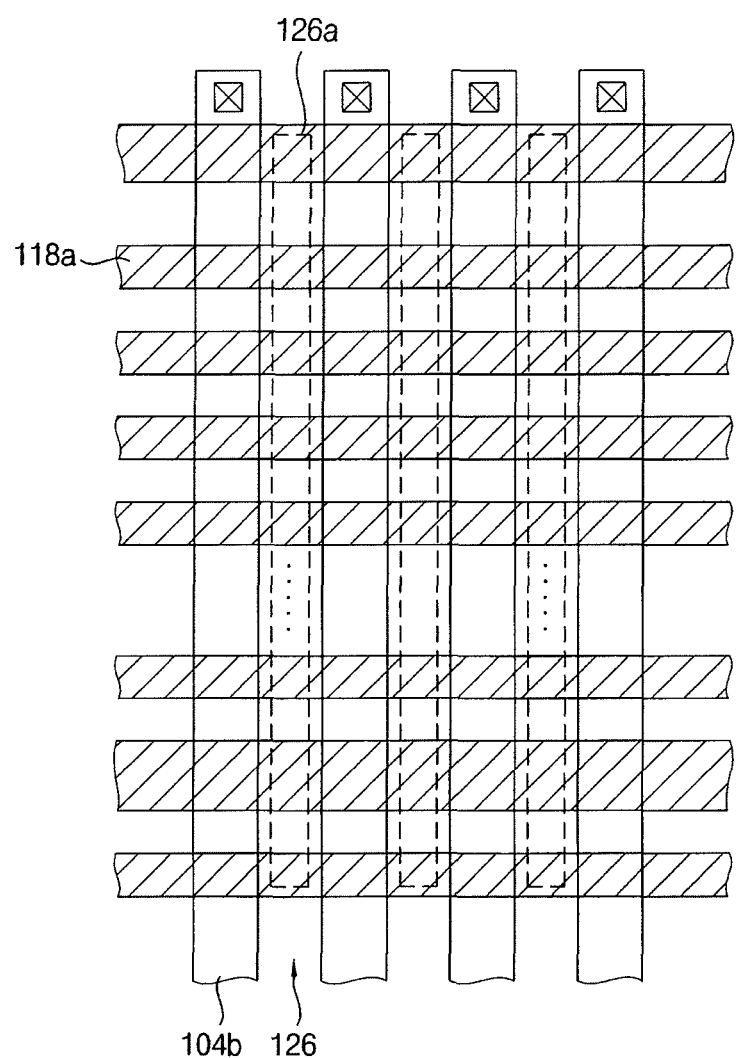
FIG. 20B is a plan view illustrating the semiconductor device in FIG. 20A.

FIG. 20A is a perspective view illustrating a semiconductor device in accordance with an example embodiment. FIG. 20B is a plan view illustrating the semiconductor device in FIG. 20A. The device may be substantially the same as or similar to that illustrated with reference to FIG. 1 except for the shape of an air gap in an isolation layer pattern and an insulating interlayer pattern.

Referring to FIG. 20A, a gate structure including, for example, a tunnel insulation layer 102a, a floating gate 104b, a dielectric layer pattern 117 and a control gate 118a may be formed on a substrate 100 including a trench 108. A third isolation layer pattern 126 including a third air gap 126a may be formed in the trench 108, and the third air gap 126a may be positioned between adjacent floating gates 104b. The third air gap 126a may have a shape substantially the same as that of the first air tunnel 114 extending in the first direction. A third insulating interlayer pattern 130 may be formed in the opening 128 between the control gates 118a to extend, for example, in the second direction substantially perpendicular to the first direction.

The semiconductor device illustrated in FIG. 20A may be manufactured by performing processes substantially the same or similar to those illustrated with reference to FIGS. 4 to 18.

After performing the processes illustrated with reference to FIGS. 4 to 9, a conductive layer 118, a dielectric layer 116 and a preliminary floating gate 104a may be etched to form the control gate 118a, the dielectric layer patterns 117 and the floating gate 104b, respectively, and the opening 128. The opening 128 between the control gates 118a may not be in fluid communication with the third air gap 126a in the third isolation layer pattern 126. The third insulating interlayer pattern 130 may be formed in the opening 128. Thus, the semiconductor device in FIG. 20A may be manufactured.

Figure 21A:
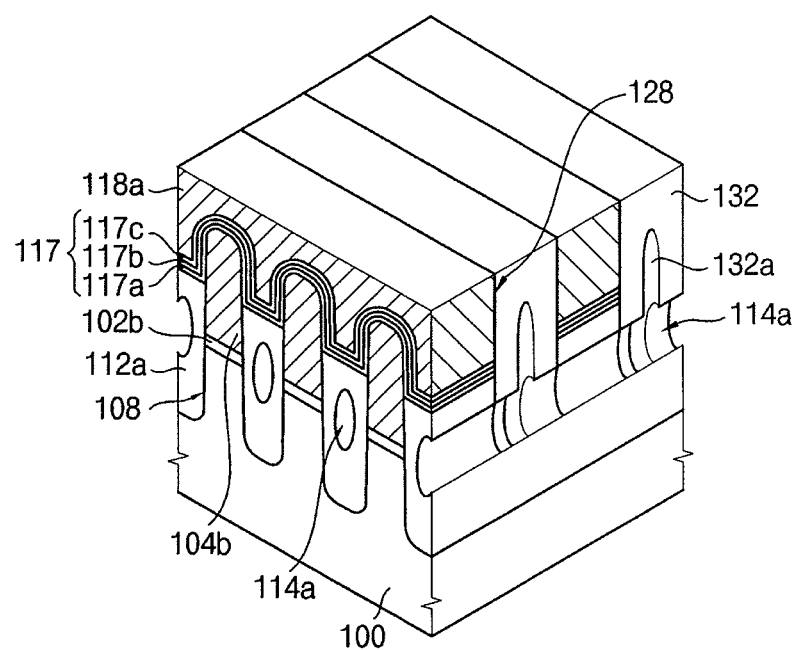
FIG. 21A is a perspective view illustrating a semiconductor device in accordance with an example embodiment of the present inventive concept.
Figure 21B:
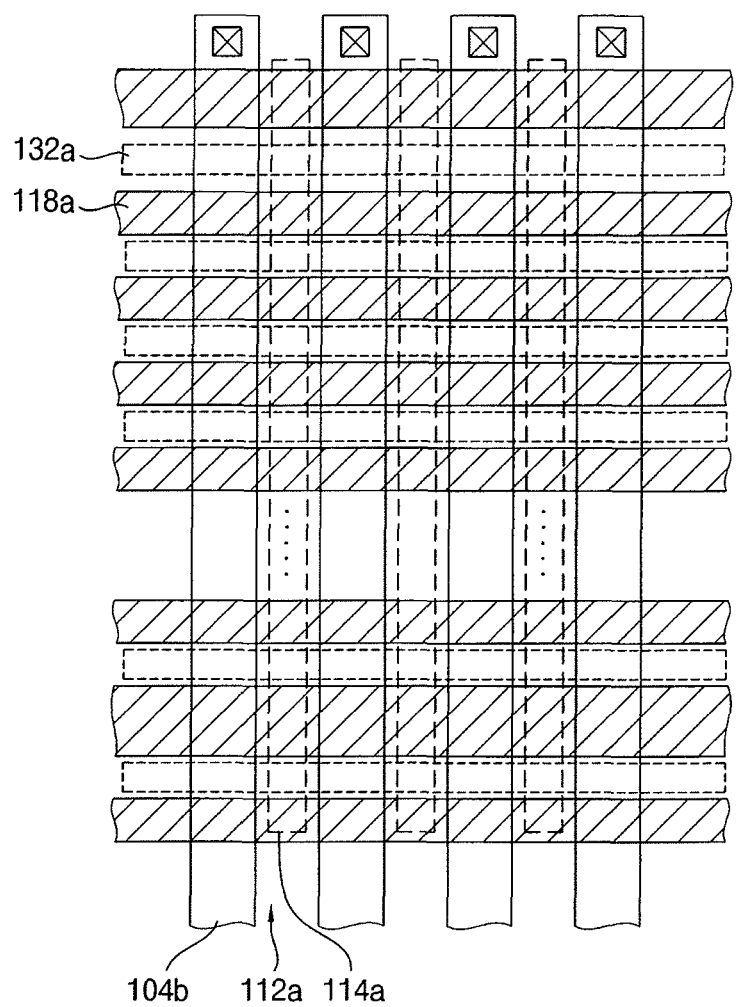
FIG. 21B is a plan view illustrating the semiconductor device in FIG. 21A.

FIG. 21A is a perspective view illustrating a semiconductor device in accordance with an example embodiment of the present inventive concept. FIG. 21B is a plan view illustrating the semiconductor device in FIG. 21A. The device is substantially the same as or similar to that that illustrated with reference to FIG. 1 except for the shape and position of air gaps.

Referring to FIGS. 21A and 21B, for example, a tunnel insulation layer pattern 102b, a floating gate 104b, a dielectric layer pattern 117 and a control gate 118a may be formed on a substrate 100 including a trench 108. The first isolation layer pattern 112a including, for example, the first air tunnel 114 may be formed in the trench 108, and the first air tunnel 114 may be positioned between adjacent floating gates 104b. The first air tunnel 114 may extend, for example, in a first direction. A fourth insulating interlayer pattern 132 may be formed in the opening 128 between the control gates 118a to extend, for example, in a second direction substantially perpendicular to the first direction. The fourth insulating interlayer pattern 132 may have fourth air gap 132a in fluid communication with the first air tunnel 114. The fourth air gap 132a may, for example, extend in the second direction.

The semiconductor device illustrated in FIG. 21A may be manufactured by performing processes substantially the same or similar to those illustrated with reference to FIGS. 4 to 18.

After performing the processes illustrated with reference to FIGS. 4 to 9, a conductive layer 118, a dielectric layer 116, a preliminary floating gate 104a and a tunnel insulation layer 102a may be etched to form the control gate 118a, the dielectric layer pattern 117, the floating gate 104b and the tunnel insulation layer pattern 102b, respectively. The opening 128 between the control gates 118a may be in fluid communication with the first air tunnel 114 in the first isolation layer pattern 112a.

The fourth insulating interlayer pattern 132 may be formed in the opening 128, for example, only at an upper portion and a sidewall of the opening 128. Thus, the fourth air gap 132a may be formed in the fourth insulating interlayer pattern 132. The fourth air gap 132a may be in fluid communication with the first air tunnel 114 in the first isolation layer pattern 112a.

The FIG. 22 is a cross-sectional view illustrating a semiconductor device in accordance with an example embodiment of the present inventive concept. FIG. 23 is a perspective view illustrating the semiconductor device of FIG. 22.

Referring to FIGS. 22 and 23, the semiconductor device may have a gate structure including, for example, a tunnel insulation layer pattern 202b, a charge storing layer pattern 204b, a dielectric layer pattern 212a and a control gate 214a, a first isolation layer pattern 208a having a first air gap 210a therein, and a first insulating interlayer pattern 218.

The substrate 200 may include a plurality of trenches 206 therein. For example, trench 206 may extend in a first direction, and the trenches 206 may be spaced apart form each other in a second direction substantially perpendicular to the first direction. A region of the substrate 200 in which no trench is formed may be defined as an active region.

The tunnel insulation layer pattern 202b may be formed on the active region of the substrate 200. The tunnel insulation layer pattern 202b may include, for example, silicon oxide, silicon oxynitride, silicon oxide doped with impurities or a dielectric material having a low dielectric constant.

The charge storing layer pattern 204b may be formed on the tunnel insulation layer pattern 202b. A plurality of charge storing layer patterns 204b may be arranged to be spaced apart from each other both in the first and second directions. For example, the charge storing layer pattern 204b may be positioned at a given interval in the first direction on the active region extending in the first direction, and the charge storing layer pattern 204b may be also positioned at a given interval in the second direction. Each memory cell may include each charge storing layer pattern 204b so that a plurality of memory cells may be formed at places where the plurality of charge storing layer patterns 204b is formed. In an example embodiment, the charge storing layer pattern 204b may be a charge trapping layer pattern including, for example, silicon nitride. In an example embodiment, the charge storing layer pattern 204b may be, for example, a floating gate including polysilicon. Hereinafter, a floating gate may be explained as the charge storing layer pattern 204b for convenience.

In an example embodiment, the floating gate 204b may have a thickness of, for example, about 0.1 to 10 times of the thickness of the tunnel insulation layer pattern 202b. The floating gate 204b may have a relatively small thickness as illustrated in FIG. 22. When the floating gate 204b has a relatively large thickness, a parasitic capacitance between adjacent floating gates 204b may be increased so that interference between adjacent cells may occur. Due to the interference, a threshold voltage of a standard cell transistor may be affected by data in an adjacent cell. As a design rule decreases, a space between the floating gates 204b may be decreased, so that defects due to the interference may increase. However, according to an example embodiment, the floating gate 204b may have a relatively small thickness so that the interference may be reduced.

The floating gate 204b may have a width of, for example, about 0.1 to 1.0 times of the distance between central portions of adjacent active regions. The width of the floating gate 204b may be smaller than that of the active region. Thus, the semiconductor device may have an increased coupling ratio.

The first isolation layer pattern 208a may be formed in the trench 206. The first isolation layer pattern 208a may be formed using, for example, silicon oxide. In an example embodiment, the first isolation layer pattern 208a may have a thickness of less than, for example, about 100 Å.

The first isolation layer pattern 208a may include an air gap 210a therein. The air gap 210a may extend near a sidewall of the floating gate 204b downward. A bottom of the air gap 210a may be positioned in the trench 206. A top surface of the air gap 210a may be, for example, lower than a bottom of the dielectric layer pattern 212a and higher than a bottom of the floating gate 204b. The bottom of the air gap 210a may be, for example, lower than the bottom of the floating gate 204b and higher than the bottom of the trench 206.

The air gap 210a may be formed between adjacent floating gates 204a, and the air gaps 210a in the trench 206 may be spaced apart from etch other. In an example embodiment, the air gap 210a may have a cross-section of, for example, an elliptical shape or a rectangular shape. Also, the air gap 210a may have a cross-section of, for example, a rectangular shape at an upper portion thereof and an elliptical shape at a lower portion thereof.

The air gaps 210a may be formed between the active regions and also between sidewalls of the floating gates 204b. Thus, a parasitic capacitance between the floating gates 204b and a parasitic capacitance between the floating gate 204b and the active region may be reduced.

The dielectric layer pattern 212a may be formed on the first isolation layer pattern 208a. The dielectric layer pattern 212a may include a dielectric material having a high dielectric constant. In an example embodiment, the dielectric layer pattern 212a may, for example, extend in the second direction. Alternatively, the dielectric layer pattern 212a may be formed, for example, on the whole of the first isolation layer pattern 208a. In an example embodiment, the dielectric layer pattern 212a may include, for example, a metal oxide having a dielectric constant greater than about 10. The dielectric layer pattern 212a may include, for example, tantalum oxide ($Ta_2O_5$), titanium oxide ($TiO_2$), hafnium oxide ($HfO_2$), zirconium oxide ($ZrO_2$), hafnium silicate ($HfSi_xO_y$), zirconium silicate ($ZiSi_xO_y$), nitrided hafnium silicate ($HfSi_xO_yN_z$), nitrided zirconium silicate ($ZrSi_xO_yN_z$), aluminum oxide ($Al_2O_3$), nitrided aluminum oxide ($Al_xO_yN_z$), hafnium aluminate ($HfAl_xO_y$), yttrium oxide ($Y_2O_3$), niobium oxide ($Nb_2O_5$), cesium oxide ($CsO_2$), indium oxide ($InO_3$), lanthanum oxide ($LaO_2$), strontium titanium oxide ($SrTiO_3$), lead titanium oxide ($PbTiO_3$), strontium ruthenium oxide ($SrRuO_3$) or calcium ruthenium oxide ($CaRuO_3$). These may be used alone or in a combination thereof.

The control gate 214a may be formed on the dielectric layer pattern 212a. The control gate 214a may have, for example, a bar shape extending the second direction. The control gate 214a may include, for example, a metal nitride having a high work function of about 4.6 to about 5.2 eV. The control gate 214a may include, for example, a metal nitride such as tantalum nitride and/or titanium nitride.

When the control gate 214a includes a metal nitride having a high work function, the energy barrier between the control gate 214a and the dielectric layer pattern 212a may increase, so that a back tunneling of charges from the control gate 214a to the dielectric layer pattern 212a may be avoided.

In an example embodiment, the control gate 214a may have, for example, a multi-layered structure of a metal nitride layer and a polysilicon layer. When the dielectric layer pattern 212a includes a metal oxide, the control gate 214a may not be formed using polysilicon due to the Fermi-level pinning effect. For example, a polysilicon layer formed on the dielectric layer pattern 212a including a metal oxide may have a work function lower than that of a polysilicon layer formed on the dielectric layer pattern 212a including silicon oxide. Also, the work function of the polysilicon layer may not be readily controlled according to an amount of impurities. Thus, the control gate 214a including a metal nitride should be formed on the dielectric layer pattern 212a.

A first insulating interlayer pattern 218 may be formed between the gate structures, and may extend in the second direction. The first insulating interlayer pattern 218 may include, for example, silicon oxide.

According to an example embodiment, the semiconductor device may have the first insulation layer pattern 208a having the plurality of air gaps 210a between the floating gates 204b so that a parasitic capacitance between the floating gates 204b may be reduced. Thus, windows for programming and windows for erasing may be separated due to the reduced interference between adjacent memory cells, such that a multi-level capacitor (MLC) using one memory cell for programming/erasing a plurality of data may be realized.

FIGS. 24 to 26 are cross-sectional views illustrating a method of manufacturing the semiconductor device in FIG. 22 in accordance with an example embodiment of the present inventive concept, and FIG. 27 is a perspective view illustrating the method of manufacturing the semiconductor device in FIG. 22.

Referring to FIG. 24, a preliminary tunnel insulation layer 202 and a charge storing layer 204 may be sequentially formed on a substrate 200. In an example embodiment, the substrate 200 may include, for example, single-crystalline silicon. The preliminary tunnel insulation layer 202 may be formed by, for example, a thermal oxidation process on the substrate 200.

In an example embodiment, the charge storing layer 204 may be a floating gate layer formed using, for example, polysilicon. In an example embodiment, the charge storing layer 204 may be a charge trapping layer formed using, for example, silicon nitride. The charge storing layer 204 may be formed to have a thickness of, for example, about 0.1 to 10 times of the thickness of the preliminary tunnel insulation layer 202. Hereinafter, a floating gate layer may be explained as the charge storing layer 204 for convenience.

A first mask 205 may be formed on the floating gate layer 204. The first mask 205 may serve as an etching mask for forming a trench, and may have, for example, a bar shape extending in a first direction. In an example embodiment, the first mask 205 may be, for example, a photoresist pattern or a hard mask.

Referring to FIG. 25, the floating gate layer 204, the preliminary tunnel insulation layer 202 and an upper portion of the substrate 200 may be sequentially etched using, for example, the first mask 205 as an etching mask. Thus, a preliminary floating gate 204a and a tunnel insulation layer 202a may be formed on the substrate 200, and a trench 206 may be formed in the substrate 200. A region of the substrate 200 on which the trench is not formed may be defined as an active region.

A first isolation layer 208 including a first air tunnel 210 therein may be formed in the trench 206 and in the gap between the preliminary floating gates 204*a*. For example, a first insulation layer (not shown) may be formed on an inner wall of the trench 206, sidewalls of the tunnel insulation layer 202*a* and the preliminary floating gate 204*a* to partially fill the trench 206. For example, the first insulation layer may be formed using silicon oxide such as PEOX or MTO by a CVD process, a PECVD process or a LPCVD process. An upper face of the first insulation layer that is formed at a lowest level may become a bottom of the first air tunnel 210. A second insulation layer (not shown) may be formed on the first insulation layer to fill an upper portion of the gap between the preliminary floating gates 204*a*. The second insulation layer may be formed using, for example, a material having poor step coverage characteristics, and may be merged with the first insulation layer into a single layer. The first air tunnel 210 may, for example, extend in the first direction parallel to the extending direction of the trench 206.

In an example embodiment, for example, a top surface of the first air tunnel 210 in the first isolation layer 208 may be formed at a level higher than a bottom of the preliminary floating gate 204*a*. A bottom of the first air tunnel 210 in the first isolation layer 208 may be formed, for example, at a level lower than a bottom of the preliminary floating gate 204*a* and higher than the bottom of the trench 206.

An upper portion of the first isolation layer 208 may be removed. When the first isolation layer 208 is etched, the first air tunnel 210 may not be exposed.

Referring to FIG. 26, a dielectric layer 212 may be formed on the first isolation layer 208. The dielectric layer 212 may be formed using, for example, a metal oxide having a dielectric constant greater than 10. For example, the dielectric layer 212 may be formed using tantalum oxide ($Ta_2O_5$), titanium oxide ($TiO_2$), hafnium oxide ($HfO_2$), zirconium oxide ($ZrO_2$), hafnium silicate ($HfSi_xO_y$), zirconium silicate ($ZrSi_xO_y$), nitrided hafnium silicate ($HfSi_xO_yN_x$), nitrided zirconium silicate ($ZrSi_xO_y$), aluminum oxide ($Al_2O_3$), nitrided aluminum oxide ($Al_zO_yN_2$), hafnium aluminate ($HfAl_xO_y$), yttrium oxide ($Y_2O_3$), niobium oxide ($Nb_2O_5$), cerium oxide ($CeO_2$), indium oxide ($InO_3$), lanthanum oxide ($LaO_2$), strontium titanium oxide ($SrTiO_3$), lead titanium oxide ($PbTiO_3$), strontium ruthenium oxide ($SrRuO_3$) or calcium ruthenium oxide ($CaRuO_3$). These may be used alone or in combinations thereof. For example, the dielectric layer 212 may be formed using hafnium oxide or hafnium aluminate having a dielectric constant greater than 20.

A conductive layer 214 may be formed on the dielectric layer 212. The conductive layer 214 may be formed using, for example, a metal nitride having a work function greater than about 4.5 eV. For example, the conductive layer 214 may be formed using a metal nitride such as tantalum nitride or titanium nitride. In an example embodiment, the conductive layer 214 may be formed to have, for example, a multi-layered structure of a metal nitride layer and a polysilicon layer.

Referring to FIG. 27, a second mask (not shown) may be formed on the conductive layer 214. The second mask may serve as an etching mask to form a control gate 214*a*. The second mask may have, for example, a bar shape extending in the second direction.

The conductive layer 214, the dielectric layer 212, the preliminary floating gate 204*a*, the tunnel insulation layer 202*a*, and the first isolation layer 208 may be sequentially etched using, for example, the second mask as an etching mask to form an opening 216. Thus, a gate structure including a tunnel insulation layer pattern 202*b*, a floating gate 204*b*, a dielectric layer pattern 212*a* and a control gate 214*a* may be formed, and the first isolation layer 208 may be transformed into a first isolation layer pattern 208*a*. The floating gate 204*b* may have, for example, an island shape. The tunnel insulation layer patterns 202*b* may also have, for example, an island shape. The opening 216 may be in fluid communication with the first air tunnels 210.

Referring to FIG. 23 again, a first insulating interlayer pattern 218 may be formed to fill the opening 216 between adjacent gate structures. When the first insulating interlayer pattern 218 may be formed in the opening 216, a portion of the first air tunnel 210 in fluid communication with the opening 216 may be also filled with the first insulating interlayer pattern 218. Thus, a plurality of first air gaps 210*a* having, for example, an island shape may be formed between the floating gates 204*b*.

FIG. 28 is a perspective view illustrating a semiconductor device in accordance with an example embodiment of the present inventive concept. The semiconductor device may be substantially the same or similar to that illustrated with reference to FIG. 22, except for a shape of a first insulating interlayer pattern.

Referring to FIG. 28, the semiconductor device may have a gate structure including, for example, a tunnel insulation layer pattern 202*b*, a floating gate 204*b*, a dielectric layer pattern 212*a* and a control gate 214*a*, a first isolation layer pattern 208 having a first air gap 210*a* therein, and a first insulating interlayer pattern 222 having a second air gap 224 therein.

The substrate 200 may include a plurality of trenches 206 therein.

The first isolation layer pattern 208*a* may be formed in the trench 206, and the air gaps 210*a* may be formed between adjacent floating gates 204*b*. The first air gaps 210*a* may have, for example, an island shape substantially the same or similar to those illustrated with reference to FIG. 22.

A first insulating interlayer pattern 222 may be formed between the gate structures, and may, for example, extend in a second direction. The second air gaps 224 may be formed between adjacent control gates 214*a*, and may, for example, extend in the second direction.

The semiconductor device of FIG. 28 may be manufactured by performing the processes substantially the same or similar to those illustrated with reference to FIGS. 24 to 27.

After performing the processes illustrated with reference to FIGS. 24 to 27, the first insulating interlayer pattern 222 including the second air gaps 224 may be formed to fill an opening 216 between adjacent gate structures. When the first insulating interlayer pattern 222 may be formed in the opening 216, a portion of a first air tunnel (not shown) in fluid communication with the opening 216 may be also filled with the first insulating interlayer pattern 222. Thus, a plurality of first air gaps 210*a* having, for example, an island shape may be formed between the floating gates 204*b*.

FIG. 29 is a perspective view illustrating a semiconductor device in accordance with an example embodiment of the present inventive concept. The semiconductor device may be substantially the same or similar to that illustrated with reference to FIG. 22, except for a shape of air gaps in a first isolation layer pattern.

Referring to FIG. 29, the semiconductor device may have a gate structure including, for example, a tunnel insulation layer pattern 202*b*, a floating gate 204*b*, a dielectric layer pattern 212a and a control gate 214a, a first isolation layer pattern 220 having a first air gap 220a therein, and a first insulating interlayer pattern 218.

The first isolation layer pattern 220 may be formed in a trench 206, and the first air gaps 220a may be formed between adjacent floating gates 204b. The first air gaps 220a may, for example, extend in a direction substantially parallel to the extending direction of the trench 206.

The first insulating interlayer pattern 218 may be formed in an opening 216 between adjacent control gates 214a.

The semiconductor device of FIG. 29 may be manufactured by performing processes substantially the same or similar to those illustrated with reference to FIGS. 24 to 27.

After performing the processes illustrated with reference to FIGS. 24 to 26, a conductive layer 214, a dielectric layer 212 and a preliminary floating gate 204a may be sequentially etched to form a floating gate 204b, a dielectric layer pattern 212a, a control gate 214a and an opening 216. For example, a bottom of the opening 216 may be formed at a level higher than a top surface of the first air gap 220a, so that the opening 216 may not be in fluid communication with the first air gap 220a. Thus, the semiconductor device may be manufactured.

FIG. 30 is a perspective view illustrating a semiconductor device in accordance with an example embodiment of the present inventive concept. The semiconductor device may be substantially the same or similar to that illustrated with reference to FIG. 29, except that a second air gap is formed in a first insulating interlayer pattern.

Referring to FIG. 30, the semiconductor device may have a gate structure including, for example, a tunnel insulation layer pattern 202b, a floating gate 204b, a dielectric layer pattern 212a and a control gate 214a, a first isolation layer pattern 220 having a first air gap 220a therein, and a first insulating interlayer pattern 226 having a second air gap 228 therein.

The first isolation layer pattern 220 may be formed in a trench 206, and the first air gaps 220a may be formed between adjacent floating gates 204b. The first air gaps 220a may, for example, extend in a direction substantially parallel to an extending direction of the trench 206.

The first insulating interlayer pattern 226 may be formed in an opening 216 between adjacent control gates 214a. The second air gaps 228 may, for example, extend in a direction substantially parallel to an extending direction of the opening 216. The second air gaps 228 may be in fluid communication with the first air gaps 220a.

The semiconductor device of FIG. 30 may be formed by performing processes substantially the same or similar to those illustrated with reference to FIGS. 24 to 27.

After performing the processes illustrated with reference to FIGS. 24 to 27, a conductive layer 214, a dielectric layer 212 and a preliminary floating gate 204a may be sequentially etched to form a floating gate 204b, a dielectric layer pattern 212a and a control gate 214a, and an opening 216. A first insulating interlayer pattern 226 including the second air gap 228 may be formed in the opening 216. The second air gaps 228 may be in fluid communication with the first air gaps 220a.

FIG. 31 is a perspective view illustrating a semiconductor device in accordance with an example embodiment of the present inventive concept. The semiconductor device may be substantially the same as or similar to that illustrated with reference to FIG. 22, except that a plurality of dielectric layer patterns on a floating gate is spaced apart from each other in first and second directions.

Referring to FIG. 31, the semiconductor device may have a gate structure including, for example, a tunnel insulation layer pattern 202b, a floating gate 204b, a dielectric layer pattern 230 and a control gate 232, a first isolation layer pattern 210 having a first air gap 210a therein, and a first insulating interlayer pattern 218.

The dielectric layer pattern 230 may be formed on the floating gate 204b, and may, for example, be spaced apart from each other in first and second directions. The dielectric layer pattern 230 may have, for example, an island shape, A first isolation layer pattern 210 may be formed in a trench 206, and the first air gaps 210a may be formed between adjacent floating gates 204b. The first air gaps 210a may have, for example, an island shape.

The first insulating interlayer pattern 218 may be formed in an opening 216 between adjacent control gates 232.

The semiconductor device of FIG. 31 may be formed by performing processes substantially the same or similar to those illustrated with reference to FIGS. 24 to 27.

A preliminary tunnel insulation layer 202, a floating gate layer 204 may be sequentially formed on a substrate 200 including, for example, single-crystalline silicon. A first mask 205 may be formed on the floating gate layer 204. The first mask 205 may serve as an etching mask for forming a trench, and may have, for example, a bar shape extending in a first direction. The first mask may be, for example, a photoresist pattern or a hard mask. A trench 206 may be formed on the substrate 200 using, for example, the first mask as an etching mask.

A preliminary first insulation layer pattern may be formed by performing the process illustrated with reference to FIG. 25. A dielectric layer 212 and a conductive layer 214 may be sequentially formed on the preliminary first insulation layer pattern. The conductive layer 214, the dielectric layer 212 and the preliminary floating gate 204a may be sequentially etched to form a floating gate 204b, a dielectric layer pattern 230 and a control gate 232 and an opening 216. A first insulating interlayer pattern 218 may be formed to fill the opening 216 between adjacent control gates 232, and the preliminary first insulation layer pattern may become a first isolation layer pattern 210 having a first air gap 210a therein. The first air gap 210a may have, for example, an island shape. Thus, the semiconductor device may be manufactured.

FIG. 32 is a perspective view illustrating a semiconductor device in accordance with an example embodiment of the present inventive concept.

Referring to FIG. 32, the semiconductor device may have a gate structure including, for example, a tunnel insulation layer pattern 302a, a charge trapping layer 304, a dielectric layer 312 and a control gate 314a, and a first isolation layer pattern 320 having a first air gap 320a therein.

A substrate 300 may have a trench 306 therein. The trench 306 may, for example, extend in a first direction. A region of the substrate 300 on which no trench is formed may be defined as an active region. The active region may extend in the first direction.

The first isolation layer pattern 320 may be formed in the trench 306, and the first air gaps 320a in the first isolation layer pattern 320 may, for example, extend in the first direction.

The charge trapping layer 304 and the dielectric layer 312 may be sequentially stacked on the first isolation layer pattern 320 and the tunnel insulation layer pattern 302a. The charge trapping layer 304 and the dielectric layer 312 may be formed both on the active region and a field region on which the first isolation layer pattern 320 may be formed.

In an example embodiment, for example, the charge trapping layer 304 may include silicon nitride and the dielectric layer 312 may include a metal oxide having a high dielectric constant. The control gate 314a may have, for example, a bar shape extending in a second direction substantially perpendicular to the first direction.

FIG. 33 is a graph illustrating a parasitic capacitance of the semiconductor device in accordance with Examples and Comparative Example. Example 1 is a semiconductor device illustrated with reference to FIG. 1, which has an air gap between active regions. Example 2 is a semiconductor device illustrated with reference to FIG. 22, which has an air gap between active regions and thin floating gates. Comparative Example 1 is a semiconductor device which has no air gap between active regions. The parasitic capacitances of Examples and Comparative Example were measured using a simulation method. Reference numeral 10 illustrates a parasitic capacitance between active regions, and reference numeral 12 illustrates a parasitic capacitance between control gates. As shown in FIG. 33, Examples 1 and 2 show reduced parasitic capacitances between control gates.

According to an example embodiment of the present inventive concept, the semiconductor device may have a reduced parasitic capacitance and a good reliability. The semiconductor device according to an example embodiment of the present inventive concept may be used in a highly integrated semiconductor device.

Having described exemplary embodiments of the present inventive concept, it is further noted that it is readily apparent to those of reasonable skill in the art that various modifications may be made without departing from the spirit and scope of the invention which is defined by the metes and bounds of the appended claims.

What is claimed is:

1. A semiconductor device comprising:
    a substrate having trenches therein, each of the trenches extending in a first direction, and the trenches being spaced apart from each other in a second direction crossing the first direction;
    gate structures on the substrate, each of the gate structures extending in the second direction and including a tunnel insulation layer pattern, a floating gate, a dielectric layer pattern and a control gate sequentially stacked; and
    an insulation pattern structure in the trenches and between the gate structures, the insulation pattern structure having a first air gap and a second air gap therein, the first air gap being in a first one of the trenches, and the second air gap extending in the second direction between neighboring ones of the gate structures,
    wherein the first and second air gaps are in communication with each other, and wherein a top of the second air gap is higher than a top of the first air gap.

2. The semiconductor device of claim 1, wherein the top of the second air gap is higher than at least a portion of an upper surface of the dielectric layer pattern.

3. The semiconductor device of claim 1, wherein the top of the first air gap is lower than a lower surface of the dielectric layer pattern.

4. The semiconductor device of claim 1, wherein the floating gate is not exposed to the first air gap.

5. The semiconductor device of claim 1, wherein the insulation pattern structure contacts at least a portion of a sidewall of the floating gate.

6. The semiconductor device of claim 1, wherein the floating gate is not exposed to the second air gap.

7. The semiconductor device of claim 1, wherein the insulation pattern structure includes an isolation layer pattern and an insulating interlayer pattern, the isolation layer pattern being in at least one of the trenches, and the insulating interlayer pattern being between neighboring ones of the gate structures.

8. The semiconductor device of claim 7, wherein the first air gap is in the isolation layer pattern, and the second air gap is in the insulating interlayer pattern.

9. The semiconductor device of claim 7, wherein a top surface of the isolation layer pattern is higher than an upper surface of the tunnel insulation layer pattern.

10. The semiconductor device of claim 7, wherein the isolation layer pattern and the insulating interlayer pattern contact each other.

11. The semiconductor device of claim 7, wherein an active region is defined by neighboring ones of the trenches in the second direction.

12. The semiconductor device of claim 11, wherein each of the gate structures extends on the active region and the isolation layer pattern.

13. The semiconductor device of claim 1, wherein the first and second directions are substantially perpendicular to each other.

14. The semiconductor device of claim 1, comprising a plurality of first air gaps, each of the first air gaps extending in the first direction.

15. The semiconductor device of claim 1, wherein a lower portion of the second air gap is connected with an upper portion of the first air gap.

16. A semiconductor device comprising:
    a substrate having trenches therein, each of the trenches extending in a first direction, and the trenches being spaced apart from each other in a second direction substantially perpendicular to the first direction;
    gate structures on the substrate, each of the gate structures extending in the second direction and including a tunnel insulation layer pattern, a floating gate, a dielectric layer pattern and a control gate sequentially stacked; and
    an insulation pattern structure in the trenches and between the gate structures, the insulation pattern structure having a first air gap and a second air gap therein, the first air gap being in a first one of the trenches, and the second air gap extending in the second direction between neighboring ones of the gate structures,
    wherein the first and second air gaps are in communication with each other,
    and wherein a top of the second air gap is higher than at least a portion of an upper surface of the dielectric layer pattern.

17. The semiconductor device of claim 16, wherein a top of the first air gap is lower than a lower surface of the dielectric layer pattern.

18. The semiconductor device of claim 16, wherein the top of the second air gap is higher than a top surface of the first air gap.

19. The semiconductor device of claim 16, wherein the insulation pattern structure includes an isolation layer pattern and an insulating interlayer pattern, the isolation layer pattern being in each of the trenches, and the insulating interlayer pattern being between neighboring ones of the gate structures.

20. The semiconductor device of claim 19, wherein a top surface of the isolation layer pattern is higher than an upper surface of the tunnel insulation layer pattern.

* * * * *